(12) United States Patent
Lee

(10) Patent No.: US 8,125,068 B2
(45) Date of Patent: Feb. 28, 2012

(54) SEMICONDUCTOR CHIP INCLUDING A CHIP VIA PLUG PENETRATING A SUBSTRATE, A SEMICONDUCTOR STACK, A SEMICONDUCTOR DEVICE PACKAGE AND AN ELECTRONIC APPARATUS INCLUDING THE SEMICONDUCTOR CHIP

(75) Inventor: Jong-Joo Lee, Suwon-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 113 days.

(21) Appl. No.: 12/545,323

(22) Filed: Aug. 21, 2009

(65) Prior Publication Data

US 2010/0044847 A1 Feb. 25, 2010

(30) Foreign Application Priority Data

Aug. 22, 2008 (KR) .............................. 2008-0082516

(51) Int. Cl.
*H01L 23/02* (2006.01)
(52) U.S. Cl. ........................ 257/686; 257/777
(58) Field of Classification Search .................. 257/686, 257/777, 723, 724, 784
See application file for complete search history.

(56) References Cited

U.S. PATENT DOCUMENTS

| | | | |
|---|---|---|---|
| 7,355,273 B2 * | 4/2008 | Jackson et al. ................ | 257/686 |
| 7,598,617 B2 * | 10/2009 | Lee et al. ...................... | 257/777 |
| 2004/0207082 A1 | 10/2004 | Yamano et al. | |
| 2007/0017057 A1 | 1/2007 | Zimmerle et al. | |
| 2007/0155048 A1 * | 7/2007 | Lee et al. ...................... | 438/106 |
| 2008/0105984 A1 * | 5/2008 | Lee .................. | 257/777 |
| 2009/0267211 A1 * | 10/2009 | Chung et al. .................. | 257/686 |
| 2010/0207278 A1 * | 8/2010 | Kwon et al. .................. | 257/777 |
| 2010/0320600 A1 * | 12/2010 | Pratt ............................. | 257/737 |

FOREIGN PATENT DOCUMENTS

| | | |
|---|---|---|
| JP | 2004-319707 | 11/2004 |
| KR | 2004-90493 | 10/2004 |
| KR | 10-0621992 | 9/2006 |
| KR | 10-699807 | 3/2007 |

* cited by examiner

*Primary Examiner* — Sheila V Clark
(74) *Attorney, Agent, or Firm* — Stanzione & Kim, LLP

(57) ABSTRACT

A semiconductor chip including a chip via plug penetrating a substrate, a semiconductor stack thereof, a semiconductor device package thereof, and an electronic apparatus having the same are disclosed. The semiconductor chip comprising, a substrate including an inner semiconductor circuit, a conductive redistribution structure formed on the substrate including a conductive redistribution interconnection and a conductive redistribution via plug, wherein the redistribution via plug is connected to the inner semiconductor circuit; a conductive chip pad formed on the substrate, and a conductive chip via plug configured to penetrate the substrate and electrically connected to the redistribution structure.

16 Claims, 15 Drawing Sheets

SEMICONDUCTOR CHIP INCLUDING A CHIP VIA PLUG PENETRATING A SUBSTRATE, A SEMICONDUCTOR STACK, A SEMICONDUCTOR DEVICE PACKAGE AND AN ELECTRONIC APPARATUS INCLUDING THE SEMICONDUCTOR CHIP

CROSS-REFERENCE TO RELATED APPLICATIONS

This application claims priority under 35 U.S.C. §119(a) from Korean Patent Application No. 10-2008-0082516, filed Aug. 22, 2008, the contents of which are hereby incorporated herein by reference in their entirety.

BACKGROUND

1. Field of the Invention

Exemplary embodiments relate to a semiconductor chip, a semiconductor chip stack, a semiconductor device package, and an electronic apparatus including the semiconductor chip.

2. Description of the Related Art

In order to improve integration density, capacity and operating speed of a semiconductor device, a method of stacking a plurality of semiconductor chips has been suggested.

SUMMARY

Example embodiments provide a semiconductor chip including a chip via plug penetrating a substrate.

Exemplary embodiments also provide a semiconductor stack of a plurality of semiconductor chips including a semiconductor chip including a chip via plug penetrating a substrate.

Exemplary embodiments further provide a semiconductor device package including a semiconductor chip including a chip via plug penetrating a substrate.

Exemplary embodiments further provide an electronic apparatus including a semiconductor chip including a chip via plug penetrating a substrate.

Additional features and utilities of the present general inventive concept will be set forth in part in the description which follows and, in part, will be obvious from the description, or may be learned by practice of the general inventive concept.

According to exemplary embodiments, a semiconductor chip includes a substrate including an inner semiconductor circuit, a conductive redistribution structure formed on the substrate including a conductive redistribution interconnection and a conductive redistribution via plug, wherein the redistribution via plug is connected to the inner semiconductor circuit; a conductive chip pad formed on the substrate, and a conductive chip via plug configured to penetrate the substrate and electrically connected to the redistribution structure.

According to other exemplary embodiments, a semiconductor chip includes a substrate including an inner semiconductor circuit, a conductive redistribution structure formed on a surface of the substrate and electrically connected to the inner semiconductor circuit through a conductive redistribution via plug, and a conductive chip via plug penetrating the substrate, the chip via plug connected to the redistribution structure.

According to still other exemplary embodiments, a semiconductor stack includes a first semiconductor chip, and a second semiconductor chip stacked on the first semiconductor chip, wherein each of the semiconductor chips comprises, a substrate including an inner semiconductor circuit, a conductive redistribution structure formed on the substrate including a conductive redistribution interconnection and a conductive redistribution via plug, wherein the redistribution via plug is connected to the inner semiconductor circuit, a conductive chip pad formed on the substrate, and a conductive chip via plug configured to penetrate the substrate and electrically connected to the redistribution structure, wherein the chip via plug and the chip pad are aligned each other, and wherein the chip via plug of the first semiconductor chip is electrically connected to the chip via plug of the second semiconductor chip.

According to still other exemplary embodiments, a semiconductor device package may include a first semiconductor chip disposed on a package substrate, and a second semiconductor chip stacked on the first semiconductor chip, wherein each of the semiconductor chips comprises, a substrate including an inner semiconductor circuit, a conductive redistribution structure formed on the substrate including a conductive redistribution interconnection and a conductive redistribution via plug, wherein the redistribution via plug is connected to the inner semiconductor circuit, a conductive chip pad formed on the substrate, and a conductive chip via plug configured to penetrate the substrate and to electrically connect to the redistribution structure, wherein the chip via plug of the first semiconductor chip is electrically connected to the chip via plug of the second semiconductor chip, and the chip via plug of the first semiconductor chip is electrically connected to a package substrate pad of the package substrate.

According to still other exemplary embodiments, an electronic apparatus may include a function unit to perform a function thereof, and an semiconductor chip connected to the function unit to control the function, and comprising, a substrate including an inner semiconductor circuit, a conductive redistribution structure formed on a surface of the substrate and electrically connected to the inner semiconductor circuit through a conductive redistribution via plug, and a chip via plug penetrating the substrate, the chip via plug connected to the redistribution structure, wherein one of the chip via plug and the redistribution structure is electrically connected to the function unit.

BRIEF DESCRIPTION OF THE DRAWINGS

These and/or other aspects and utilities of the present general inventive concept will become apparent and more readily appreciated from the following description of the embodiments, taken in conjunction with the accompanying drawings of which:.

DETAILED DESCRIPTION OF THE EMBODIMENTS

Figure 1A:
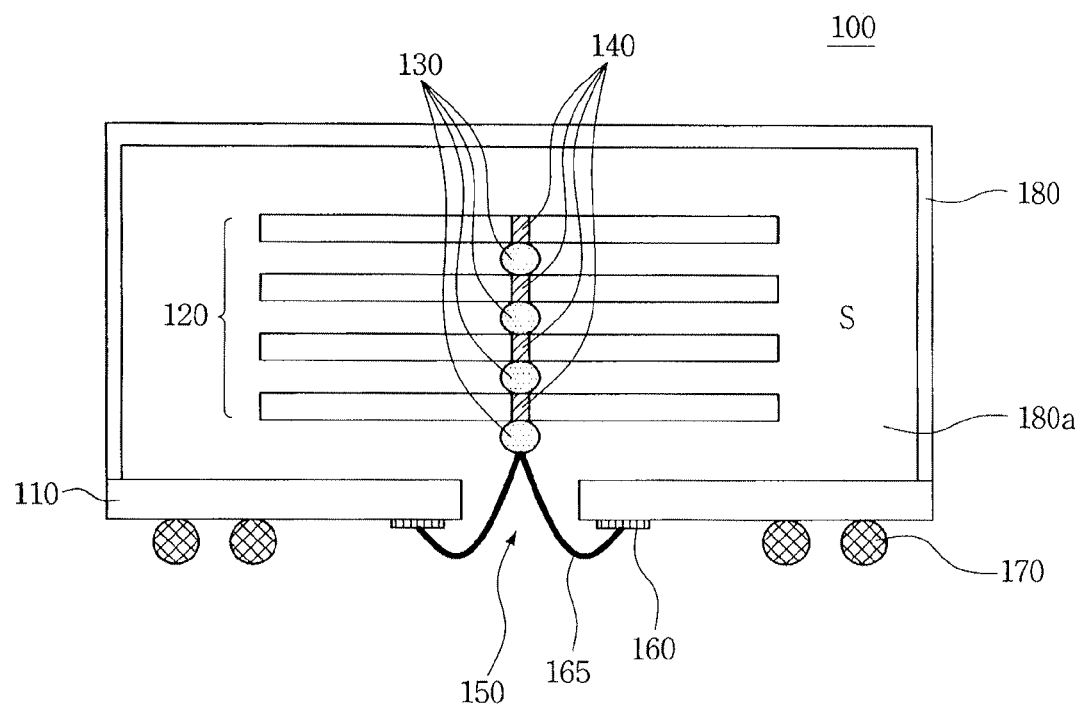
FIGS. 1A and 1B are cross-sectional views of semiconductor device packages according to exemplary embodiments of the inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

Various exemplary embodiments will now be described more fully with reference to the accompanying drawings in which some exemplary embodiments are shown. This inventive concept may, however, be embodied in different forms and should not be construed as limited to the embodiments set forth herein. These embodiments are provided to ensure that this disclosure is thorough and fully enables those skilled in the art to embody and practice the inventive concept. In the drawings, the thicknesses of layers and regions may be exaggerated for clarity. It will also be understood that when a layer is referred to as being "on" another layer or substrate, it can be directly on the other layer or substrate or intervening layers may also be present. Throughout the drawings, like elements are denoted by like reference numerals.

Exemplary embodiments in this specification will be described with reference to plan views and cross-sectional views of the inventive concept. Therefore, the exemplified drawings may vary according to a fabrication technique and/or an allowable error. Therefore, the exemplary embodiments of the inventive concept are not limited to a specific shape, but include a change in shape that is caused according to a fabrication process. Accordingly, regions illustrated in the drawing are schematic, and the shapes thereof exemplify a specific shape of a device, but are not limited thereto.

In this specification, a semiconductor chip may be construed as being in a wafer state, a semiconductor package may be construed that a plurality of semiconductor chips in a wafer state are electrically connected to each other to be packaged, and a semiconductor device or semiconductor device package may be interpreted that it can be mounted on a substrate including PCB or a module substrate.

"Being electrically connected" may be construed as being serially connected. That is, it may be interpreted that a conductor is physically connected to another conductor. On the other hand, "being electrically insulated" may be construed as being serially insulated. That is, it may be interpreted that a conductor is not directly connected to another conductor, and an insulating material may be interposed therebetween. Therefore, "being electrically connected" or "being electrically insulated" may refer to or exclude alternate connection or insulating. That is, insulating is constituted in series, and connection is constituted alternately. In this point of view, "being connected" may be interpreted as "being coupled" in this specification.

"Vias" may be conductors to transmit electric signals in vertical direction, "interconnections" may be conductors to transmit electric signals in horizontal direction and "pads" may be plane shaped conductors to connect two conductors between thereof.

Figure 1B:
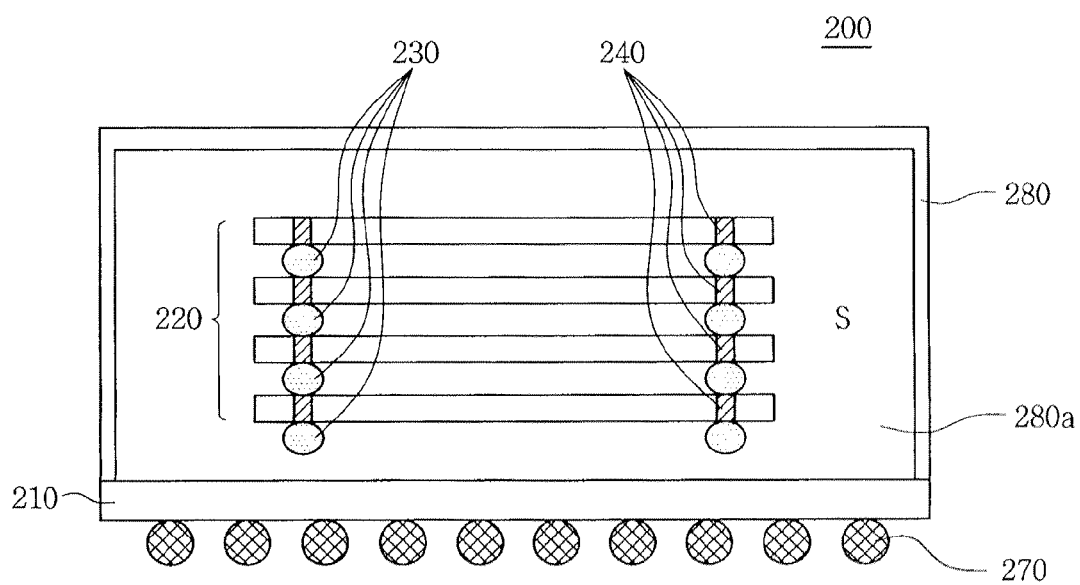

FIGS. 1A and 1B are cross-sectional views of semiconductor device packages according to exemplary embodiments of the inventive concept.

Referring to FIG. 1A, a semiconductor device package 100 according to an exemplary embodiment of the inventive concept includes a plurality of semiconductor chips 120 stacked on a first package substrate 110, chip bumps 130 electrically connecting the semiconductor chips 120 to each other, and at least one chip via plugs 140 penetrating the semiconductor chips 120.

In FIG. 1A, it is assumed that it is illustrated that a chip pad (not illustrated) of each semiconductor chip 120 is formed in the center portion. In the drawing, it is illustrated that just one semiconductor chip 120 includes just one chip via plug 140, and just the chip bumps 130 corresponding to the illustrated chip via plugs 140 are illustrated for clarity. However, actually, a plurality of chip via plugs 140 may be formed on the each semiconductor chip 120, and a plurality of chip bumps 130 may be formed as well.

While it is illustrated that a semiconductor device package 100 includes four stacked semiconductor chips 120, it should not be limited thereto. That is, two semiconductor chips 120 may be stacked, or eight or more semiconductor chips 120 may be stacked. For clarity, cases in which four semiconductor chips 120 are stacked are illustrated in the drawing.

The chip via plugs 140 are included in each semiconductor chip 120, and may be formed to penetrate each semiconductor chip 120. Therefore, each of the semiconductor chips 120 may be disposed to have an active plane either in an upward direction or in a downward direction. In the exemplary embodiment, the active planes of the semiconductor chips 120 are not regarded as being in a specific direction. For example, when the chip via plugs 140 are formed to correspond to all chip pads of the semiconductor chips 120, every input/output path of the semiconductor chips 120 is formed through the chip via plugs 140. In this case, the active plane of the semiconductor chips 120 may be stacked in a downward direction, i.e., in the direction of the first package substrate 110. The active plane may be one of surfaces (sides) of the semiconductor chips 120 through which an inner semiconductor circuit can be communicate with an external circuit disposed outside the semiconductor chips 120. It is possible that the active plane may be a plane formed on the semiconductor chips 120 to provide a plurality of communication paths between the inner semiconductor circuit and one or more external circuits.

However, when the chip via plugs 140 are not formed to correspond to all chip pads of the semiconductor chips 120, electrical connection through the chip via plug 140 and electrical connection through a bonding wire may be simultaneously applied. In this case, disposing the active planes of the semiconductor chips 120 in an upward direction may facilitate the assembly process of a semiconductor device package. Therefore, the direction of the active planes of the stacked semiconductor chips 120 are not limited regardless of the direction illustrated in the drawing.

The chip bumps 130 may electrically connect the chip via plugs 140 of the semiconductor chips 120 different from each other. Specifically, the chip bumps 130 may electrically connect the chip pads of the different semiconductor chips 120 to the chip via plugs 140 or electrically connect the chip pads to the other chip pads. The detailed description thereof will be provided below.

The chip bumps 130 may be an extended part of the chip via plugs 140, a chip pad of the semiconductor chip 120 or a part of a redistribution structure. Alternatively, the chip bumps 130 may be formed of a separate element. For example, the chip bumps 130 may be formed in the shape of a hexahedron, a polyhedron, a ball, etc.

The chip via plugs 140 of the semiconductor chips 120 disposed at a bottommost portion or the chip bumps 130 disposed therebelow may be electrically connected to a package substrate bump 170. In the exemplary embodiment, it is illustrated that the chip bumps 130 are electrically connected to package substrate pads 160 of the first package substrate 110 through a package substrate hole 150. In particular, it is illustrated that the chip bumps 130 are connected to the package substrate pads 160 through a wire 165.

The package substrate pads 160 may be electrically connected to the package substrate bumps 170 through a package substrate interconnection that is not shown. In the drawing, it is illustrated that the package substrate bump 170 is in the shape of a ball. The package substrate bumps 170 may be variously formed in terms of shape according to each specification, and in particular, when a chip socket or a module socket is used, since the shape is not restricted, the illustrated package substrate bump 170 in the shape of a ball is not a restricted element, and should be understood as an example. The detailed description of the first package substrate 110 will be provided below.

In the exemplary embodiment, the chip via plugs 140 may electrically connect the package substrate bumps 170 or the chip pads of the semiconductor chips 120 that function the same. For example, the chip via plugs 140 may be electrically connected to the package substrate bumps 170 or the chip pads of the semiconductor chips 120 that function as supply voltage nodes (i.e. Vdd node or power nodes). Alternatively, the chip via plugs 140 may be electrically connected to the package substrate bumps 170 or the chip pads of the semiconductor chips 120 that function as ground voltage nodes (i.e. Vss nodes or ground nodes). While the chip via plugs 140 may connect the chip pads of the semiconductor chips 120 having various functions and the package substrate bumps 170, it is illustrated that the chip via plugs 140 connect the package substrate bumps 170 and the chip pads for supplying a supply voltage or a ground voltage. However, it is not limited that the chip via plugs are connected to the package substrate bumps 170 and the chip pads for supplying a supply voltage or a ground voltage. The detailed descriptions of the shape and structure of the chip via plugs 140 will be provided below.

The chip via plugs 140 is connected to an inner semiconductor circuit, such as a memory circuit unit, a processing circuit unit, etc. The inner semiconductor circuit is included in the semiconductor chips 120 to store a signal or data, to process a signal or data, or to receive or transmit a signal or data, and communicates with an external circuit through the chip via plugs 140. The inner semiconductor circuit may include a voltage control circuit. The voltage control circuit may transform and/or generate several internal voltages from external voltage (power) supplied through the chip via plugs 140. When the supply voltage is a device power (Vdd), the internal voltages may be an elevated voltage (i.e. highly pumped voltage Vpp using a charge pump), a cell voltage Vcc used in cell array, a reference voltage Vref used on developing signals, a divided voltage dividing any voltages, and etc. used in a semiconductor chip. As the voltages are set forth respectively, particular voltages are not stated in through the specification. And/or, the voltage control circuit may include a ground circuit to ground the inner semiconductor circuit.

The chip via plugs 140 may be formed to penetrate a body of semiconductor chips 120 to provide a conductive path between two surfaces (sides), for example, two opposite surfaces (sides) of the body of the semiconductor chips 120. The inner semiconductor circuit may have a pad formed on one of the two surfaces, such as the active plane, to be connected to one or more external circuits, conductive lines, or communication lines, and the pad of the inner semiconductor circuit can be connected to an apparatus disposed on the other one of the two surfaces, such as a non-active plane.

In the exemplary embodiment, the stacked semiconductor chips 120 may be selectively sealed by a package cover 180. When the stacked semiconductor chips 120 are sealed, a space S formed in an inside of the package cover 180 may be filled with a filling (packing) material 180a. In another exemplary embodiment, the stacked semiconductor chips 120 may be covered with only the packing material 180a without the package cover 180. A thermoplastic or thermosetting polymer material or inorganic material, for example, an epoxy resin, benzocyclobutene (BCB), polyimide, or a ceramic material, may be as the packing material 180a.

Referring to FIG. 1B, a semiconductor device package 200 according to an exemplary embodiment of the inventive concept includes a plurality of semiconductor chips 220 stacked on a second package substrate 210, chip bumps 230 electrically connecting the semiconductor chips 220 to each other, and a plurality of chip via plugs 240 penetrating each semiconductor chips 220. In FIG. 1B, it is illustrated that chip pads of the semiconductor chips 220 are formed on the periphery of the semiconductor chips 220. In combination with FIG. 1A, it is illustrated that the positions of the chip pads of the semiconductor chips 220, the chip via plugs 240 and the chip bumps 230 may be variously changed or disposed. That is, the chip pads, the chip via plugs 240, and/or the chip bumps 230 of the semiconductor chips 220 may be disposed on center rows or areas of the semiconductor chips 220.

Also, it is illustrated that the chip bumps 230 may be electrically connected to input/output bumps 270 through interconnections (not illustrated) included in the second package substrate 210. Compared with FIG. 1A, the chip bumps 230 and/or input/output bumps 270 can be electrically connected to each other through a package substrate interconnection (not illustrated) formed in the second package substrate 210 without forming a package substrate hole (150 of FIG. 1A). However, it is not essential or necessary, and the method illustrated in FIG. 1A may be compatible with that illustrated in FIG. 1B.

In the exemplary embodiment, the stacked semiconductor chips 220 may be disposed in the package cover 280, and a space S formed in an inside of the package cover 280 may be filled with a filling (packing) material 280a. In another exemplary embodiment, the stacked semiconductor chips 220 may be covered with only the packing material 280a without the package cover 280. A thermoplastic or thermosetting polymer material or inorganic material, for example, an epoxy resin, benzocyclobutene (BCB), polyimide, or a ceramic material, may be as the packing material 280a.

Figure 2A:
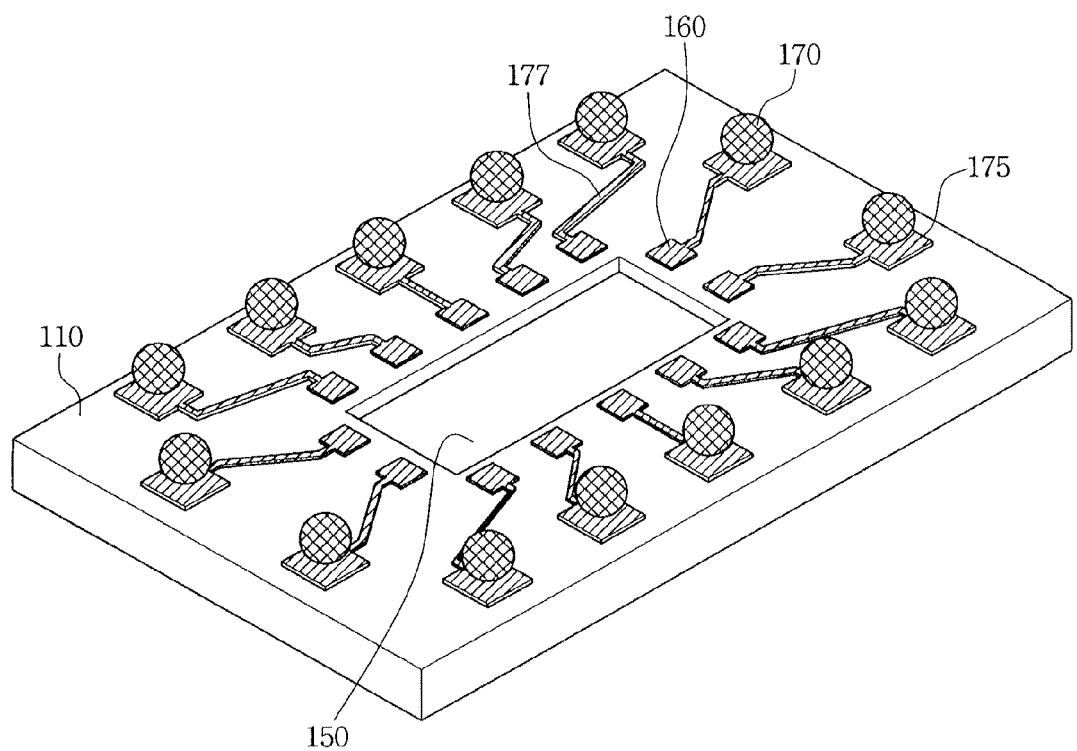
FIGS. 2A and 2B are schematic views of the package substrates illustrated in FIGS. 1A and 1B.
Figure 2B:
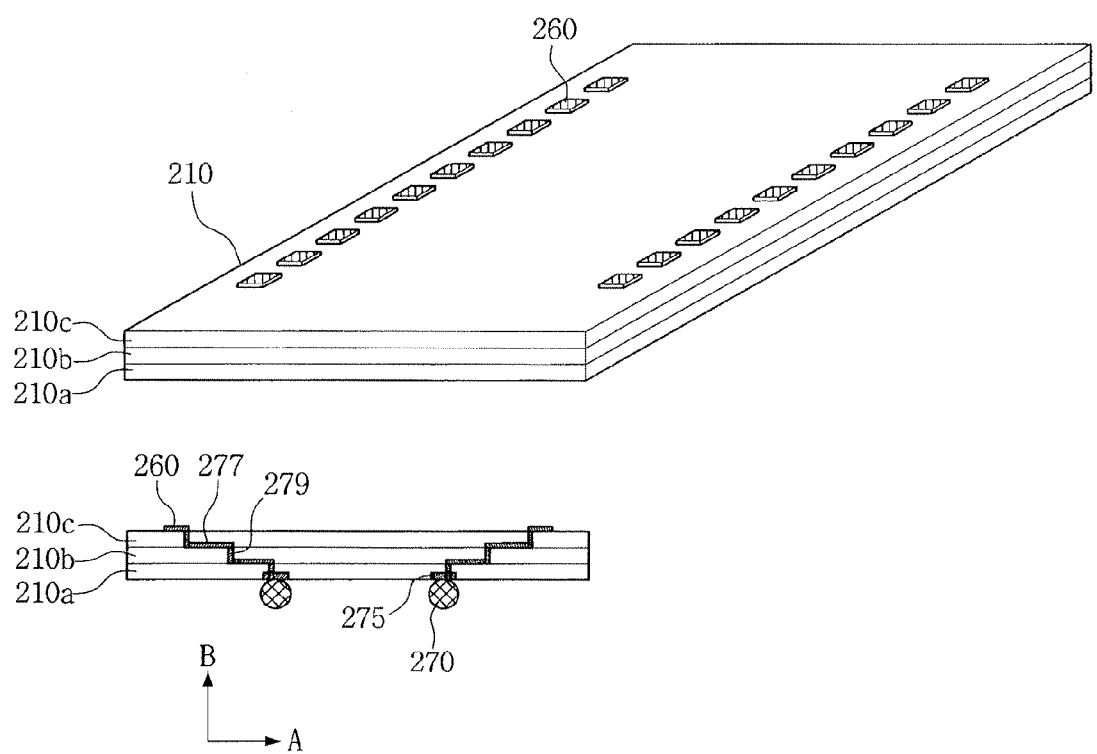

FIGS. 2A and 2B are schematic views of the package substrates 110 and 210 illustrated in FIGS. 1A and 1B.

Referring to FIG. 2A, a first package substrate 110 includes a package substrate hole 150 formed in a center portion thereof, package substrate pads 160 and package substrate bumps 170 that are formed around the package substrate holes 150. The first package substrate 110 is illustrated upside down. The semiconductor chips 120 of FIG. 1A are disposed below the first package substrate 110, and the chip bumps 130 are electrically connected to the package substrate pads 160 through the package substrate hole 150. The package substrate pads 160 are electrically connected to the package substrate bumps 170 through package substrate interconnections 177. Further, package substrate bump pads 175 may be formed below the package substrate bumps 170. In this case, the package substrate bump pads 175 may be electrically connected to the package substrate pads 160 through the package substrate interconnections 177.

The shape and arrangement of the package substrate hole 150, the package substrate pads 160, the package substrate interconnections 177 and the package substrate bumps 170 are schematically illustrated for clarity. It is illustrated that the first package substrate 110, the package substrate hole 150 and the package substrate pads 160 are in the shape of a hexahedron, and the package substrate bumps 170 are in the shape of a ball. However, the shapes should not be limited thereto.

Referring to FIG. 2B, a second package substrate 210 includes package substrate pads 260 formed on a top surface thereof, and package substrate bumps 270 formed below a bottom surface thereof. In the drawing, a number of package substrate pads 260 are illustrated for clarity.

The package substrate pads 260 are connected to the chip bumps 230 of the semiconductor chips 220, and are electrically connected to the package substrate bumps 270 through package substrate inner interconnections 277 and package substrate chip via plugs 279 that are formed in the second package substrate 210. The second package substrate 210 according to the exemplary embodiment may be formed by stacking several sheets (layers) of thin unit package substrates 210a, 210b, and 210c. Although FIG. 2B illustrates three-layer unit package substrates 210a, 210b, and 210c to be stacked, the present general inventive concept is not limited thereto.

As illustrated in FIG. 2B, the package substrate pads 260 may be disposed on a position different from a position of the package substrate bumps 270 with respect to a direction A. The positions of the package substrate pads 260 and the package substrate bumps 270 may not be disposed on a line parallel to a direction B. The package substrate inner interconnections 277 may be disposed in the direction A, and the package substrate chip via plugs 279 may be disposed in the direction B. The direction A may be a horizontal direction and the direction B may be a vertical direction.

The package substrate inner interconnections 277 may be formed between the adjacent thin unit package substrates 210a, 210b, and 210c. It is possible that the package substrate inner interconnections 277 may be formed on a surface of a corresponding one of the thin unit package substrates 210a, 210b, and 210c. It is also possible that the package substrate inner interconnections 277 may be formed in a corresponding one of the thin unit package substrates 210a, 210b, and 210c. The package substrate chip via plugs 279 may be connected to the package substrate inner interconnections 277 or may be formed to connect the package substrate inner interconnections 277 to a corresponding one of the package substrate pads 260 and the package substrate bumps 270.

The package substrate bumps 270 may be electrically connected to conductive package substrate bump pads 275 of the second package substrate 210.

Figure 3:
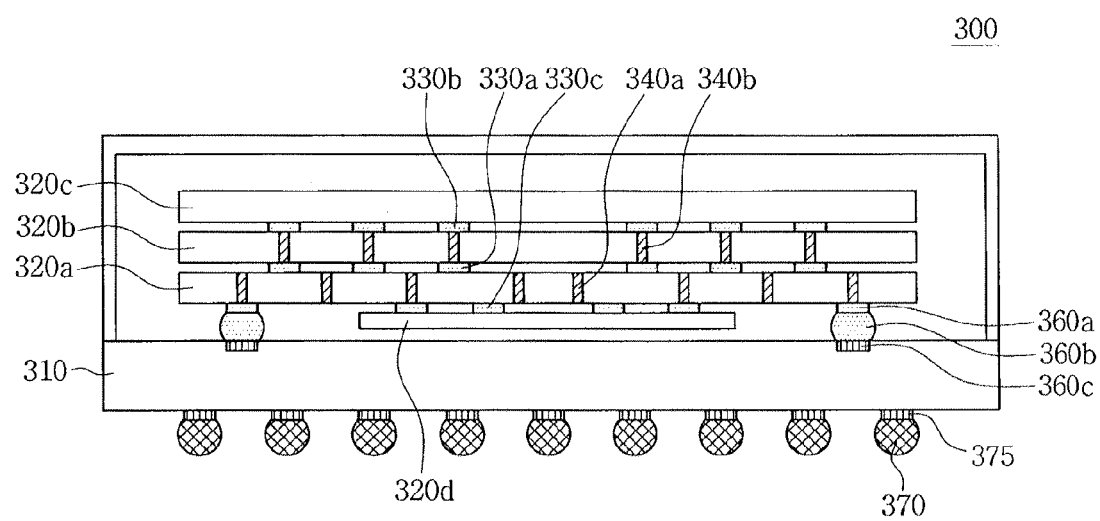
FIG. 3 is a cross-sectional view of a semiconductor device package according to another exemplary embodiment of the inventive concept.

FIG. 3 is a cross-sectional view of a semiconductor device package 300 according to an exemplary embodiment of the inventive concept.

Referring to FIG. 3, a semiconductor device package 300 according to another exemplary embodiment includes a plurality of semiconductor chips 320a, 320b, 320c, and 320d stacked on a package substrate 310, and the semiconductor chips 320a, 320b, 320c, and 320d have at least two specifications or characteristics. The specifications or characteristics may be different from each other. This shows that the technical features of the inventive concept may be applied to a technique of arranging semiconductor chips 320a, 320b, 320c, and 320d having various functions in a single semiconductor device package 300 like Multi Chip Package (MCP) or System In a Package (SIP). FIG. 3 illustrates that the four semiconductor chips 320a, 320b, 320c, and 320d having different specifications or characteristics are formed to have a stacked structure in the semiconductor device package 300.

A first semiconductor chip 320a and a second semiconductor chip 320b include chip via plugs 340a and 340b, and a third semiconductor chip 320c and a fourth semiconductor chip 320d may not include a chip via plug. However, this is to describe that the technical features of the inventive concept may be variously applied when the semiconductor chips 320a, 320b, 320c, and 320d having different specifications or characteristics are packaged into a single semiconductor device package 300. That is, it is possible that only one of the semiconductor chips 320a, 320b, 320c, and 320d may include the chip via plugs 340a and 340b, and it is also possible that all of the semiconductor chips 320a, 320b, 320c, and 320d may include the chip via plugs 340a and 340b.

The semiconductor chips 320a, 320b, 320c, and 320d may be electrically connected to each other, and while it is illustrated that the semiconductor chips 320a, 320b, 320c, and 320d are connected to each other through chip bumps 330a, 330b and 330c in the shape of a mesa, the chip bumps 330a, 330b, and 330c may be in the shape of a hexahedron, a polyhedron or a ball as described above. Further, the semiconductor chips 320a, 320b, 320c, and 320d may be electrically connected to each other through the chip bumps 330a, 330b and 330c with various structures and shapes.

Moreover, it is illustrated that the chip via plug 340a of the first semiconductor chip 320a and the chip via plug 340b of the second semiconductor chip 320b may be not aligned with each other. This may be interpreted that they may be combined with a redistribution structure, and the detailed description thereof will be provided below.

One of the semiconductor chips 320a, 320b, 320c, and 320d may include an input/output chip pad 360a connected to the package substrate 310, and the input/output chip pad 360a may be electrically connected to an input/output package substrate pad 360c through an input/output bump 360b.

The input/output package substrate pad 360c may be electrically connected to at least one of package bumps 370 or at least one of package bump pads 375 through package substrate interconnections (277 of FIG. 2B). It is possible that a portion of the package substrates 110 and 210 of FIGS. 2A and 2B may be used as the package substrate interconnections 277. It is also possible that another form of a package substrate 310 can be used as the package substrate interconnections to electrically connect the input/output package substrate pad 360c to a corresponding one of the package bump 370 and the package bump pad 375.

Each of the semiconductor chips 320a, 320b, 320c, and 320d may have a inner semiconductor circuit, such as a memory circuit unit, a processing circuit unit, a data receiving and/or transmitting circuit unit, etc. The inner semiconductor circuit unit can be disposed in a corresponding body of the semiconductor chips 320a, 320b, 320c, and 320d to be electrically connected to the chip via plug 340a or 240b through an inner circuit interconnection pad formed on or in a body of the semiconductor chips 320a, 320b, 320c, or 320d, and a distribution structure formed on or in a body of the semiconductor chips 320a, 320b, 320c, or 320d. The inner semiconductor circuit may include the voltage control circuit and/or the ground circuit as described above.

Figure 4A:
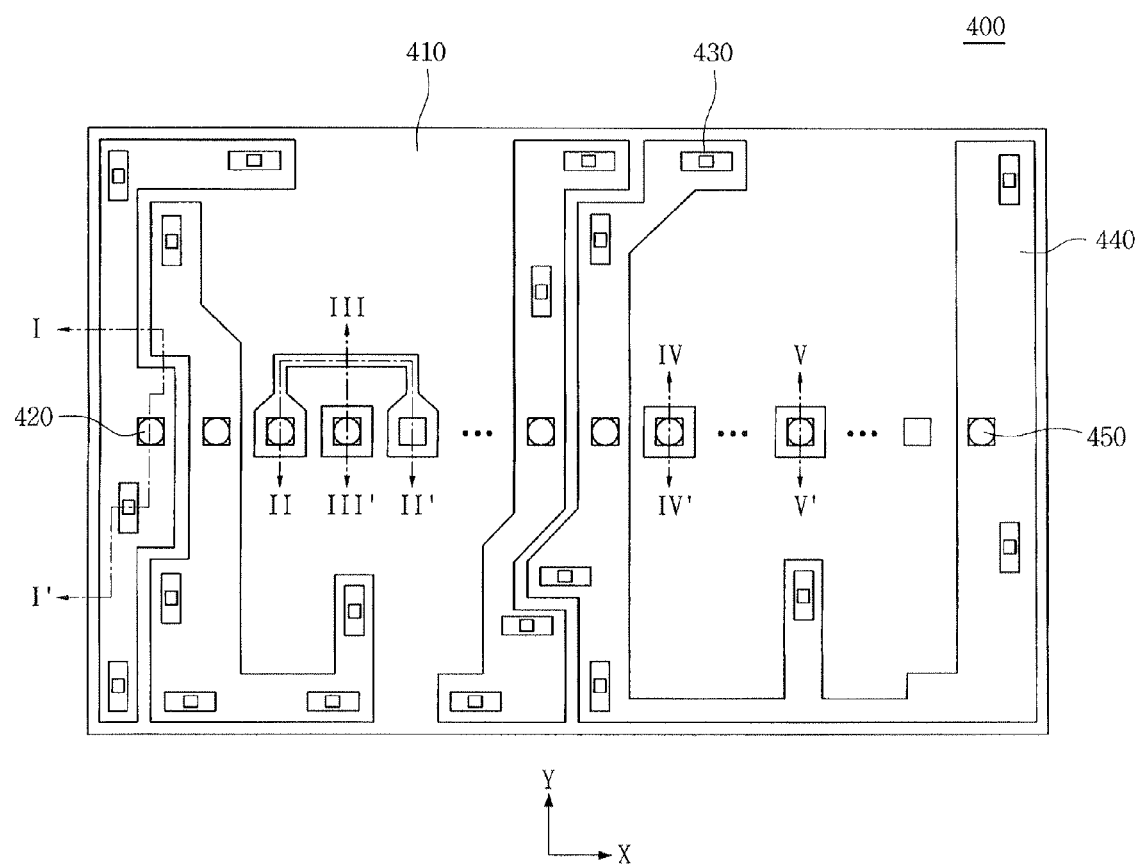
FIGS. 4A and 4B are plan views schematically illustrating semiconductor chips according to exemplary embodiments of the inventive concept.
Figure 4B:
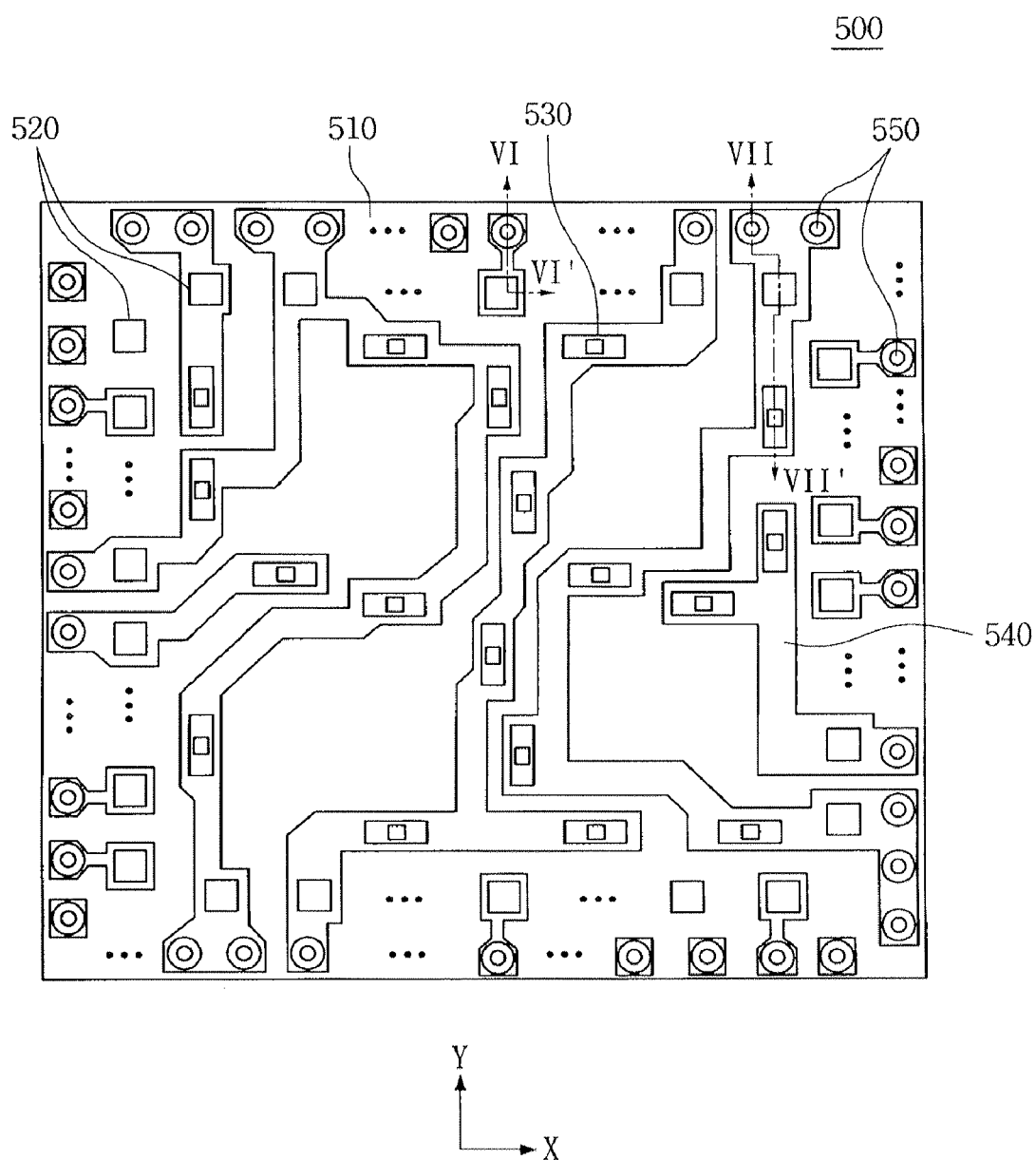

FIGS. 4A and 4B are plan views schematically illustrating semiconductor chips according to various exemplary embodiments of the inventive concept. The semiconductor chips according to exemplary embodiments of the inventive concept include substrates including inner semiconductor circuits, conductive redistribution structures and chip pads that are formed on the substrates, and conductive chip via plugs penetrating the substrates. It will be understood that when substrates are referred to as being penetrated, wafers may be penetrated. Alternatively, it may be referred to as vertically penetrating unit semiconductor chips cut by a sawing process.

It is possible that a portion of the chip via plugs can be formed on the wafers of the inner semiconductor circuits and another portion of the chip via plugs can be formed on sealing materials formed around the inner semiconductor circuits to form the substrates such that the chip via plugs can be formed in the wafer and the sealing materials. When the sealing materials are not formed around the inner semiconductor circuit to form the substrates, the chip via plugs may be formed in the inner semiconductor circuits of the substrates. In this case, the chip via plugs may be formed together with the inner semiconductor circuits during inner semiconductor circuits manufacturing process.

The redistribution structures may connect the one or more chip pads of the semiconductor chip to each other.

FIG. 4A is a plan view of a semiconductor chip 400 in which chip pads 420 are arranged in a row in the center portion of a top surface of a substrate 410. In the exemplary embodiment, while the chip pads 420 may be arranged in two or more rows, it is assumed that the chip pads 420 are arranged in a row for clarity.

Referring to FIG. 4A, the semiconductor chip 400 according to an exemplary embodiment of the inventive concept includes chip pads 420 arranged in rows and formed on the substrate 410, inner circuit interconnection pads 430, and redistribution structures 440. The chip pads 420 may have a shape of, for example, a quadrangle, and chip via plugs 450 may have a shape of, for example, a circle. Since the redistribution structures 440 are formed on the chip via plugs 450, the chip via plugs 450 are not seen partially or entirely from the plan view. However, FIG. 4A illustrates the chip via plugs 450 to be seen fully from the plan view for clarity. In addition, since most of the redistribution structures 440 are covered with an insulating passivation layer, they may not be seen as in the drawing. However, FIG. 4A illustrates the redistribution structures 440 to be seen well for clarity.

In the exemplary embodiment, the chip via plugs 450 may be formed to overlap the chip pads 420. That is, the chip pads 420 may be formed on the chip via plugs 450 or the chip via plugs 450 may be formed to penetrate the chip pads 420. The detailed description thereof will be described below.

The redistribution structures 440 may electrically connect the chip pads 420 to the inner circuit interconnection pads 430. Specifically, the redistribution structures 440 may electrically connect the chip pads 420 to each other, electrically connect the chip pads 420 to the inner circuit interconnection pads 430 or electrically connect the inner circuit interconnection pads 430 to each other. Moreover, the redistribution structures 440 may be connected to each other. Furthermore, one or more chip pads 420 may be electrically connected to one or more inner circuit interconnection pads 430. For example, the chip pads 420 providing a supply voltage or ground voltage of the semiconductor chip 400 constantly provides the same electrical power. Therefore, the chip pads 420 having such a function may be electrically connected to each other. As described above, the redistribution structures 440 may be selectively applied in the inventive concept. The redistribution structures 440 function to distribute and provide an electrical signal provided from one of the chip pads 420 to several units of the semiconductor chip 400. The redistribution structures 440 are designed to accomplish less signal loss and higher signal transfer speed than an inner semiconductor circuit of the semiconductor chip 400. In the exemplary embodiment, the redistribution structures 440 may be formed of copper (Cu), aluminum (Al), or tungsten (W), or may be formed of a metal, a metal compound or a metal alloy.

The chip via plugs 450 may be formed to penetrate the semiconductor chip 400. In the drawing, it is illustrated that the chip via plugs 450 are formed to overlap the chip pads 420, and the chip via plugs 450 are formed to correspond to most of the chip pads 420 for clarity. However, only several chip via plugs may be formed, and even only one chip via plug 450 may be formed. When there are several chip pads 420 functioning the same, one chip pad 420 may be directly connected to the one chip via plug 450, and the other chip pads 420 may be indirectly connected through the redistribution structures 440.

The substrate 410 can include one or more inner semiconductor circuits disposed in a body of the substrate 410. The inner semiconductor circuit may have one or more memory circuits or cells to receive data (signal), to store the received data, to read data stored therein, to transmit the read data, and/or to process the data. The substrate 410 may have the inner circuit interconnection pads 430 as terminals of the inner semiconductor circuit to be electrically connected to an external apparatus for the data transmission. The inner circuit interconnection pads 430 may be formed on a surface of the inner semiconductor circuit to be exposed outside thereof. It is possible that the inner circuit interconnection pads 430 may be formed on a surface of a body of the substrate 410 to be electrically connected to the inner semiconductor circuit through a conductive communication line (not illustrated) when a terminal of the inner semiconductor circuit is disposed inside of the body of the substrate 410.

According to the number of the inner semiconductor circuits, locations of the terminals of the inner semiconductor circuits, and/or input/output methods or structures of the inner semiconductor circuits, locations of the inner circuit interconnection pads 430 may vary. As illustrated in FIG. 4A, the inner circuit interconnection pads 430 may be disposed at different locations to correspond to the terminals of the inner semiconductor circuits. Therefore, the redistribution structures 440 may have different shapes or different forms to correspond to locations of the inner circuit interconnection pads 430 and/or locations of chip via plugs 450. The redistribution structures 440 may have a first form (structure) extended in both directions X and Y, a second form (structure) extended in one of the directions X and Y, a third form (structure) as a combination of the first form and the second form, or another form extended in a direction having an angle with one of the directions X and Y.

The redistribution structures 440 may have a width in a direction X or Y, and the width of the redistribution structures 440 may vary according to locations of the inner circuit interconnection pads 430 and/or locations of chip via plugs 450, and/or locations and widths of other redistribution structures 440.

The redistribution structures 440 may have a width greater than a width of the inner circuit interconnection pads 430 and/or the chip via plugs 450 in a direction X or Y or a direction parallel to a major surface of the active plane of the substrate 410 and/or the inner semiconductor circuits. It is possible that the redistribution structures 440 may have a portion with a width narrower than a width of the inner circuit interconnection pads 430 and/or the chip via plugs 450. In this case, the portion of the redistribution structures 440 may be disposed between opposite distal ends of the redistribution structures 440, between portions corresponding to the inner circuit interconnection pads 430, or between portions corresponding to the inner circuit interconnection pads 430 and the chip via plugs 450.

The chip via plugs 450 may have an area larger than an area of the inner circuit interconnection pads 430 in the direction X or Y. However, the present general inventive concept is not limited thereto. It is possible that the area of the chip via plugs 450 may be smaller than the area of the inner circuit interconnection pads 430.

The inner circuit interconnection pads 430 or the chip via plugs 450 may be formed on a location to overlap a location of the inner semiconductor circuit along a plane defined by the direction X and Y. It is possible that at least one of the inner circuit interconnection pads 430 and the chip via plugs 450 may be formed on a location not to overlap a location of the inner semiconductor circuits along a plane defined by the direction X and Y. In this case, the inner circuit interconnection pads 430 or the chip via plugs 450 may be connected to the inner semiconductor circuits through conductive communication lines (not illustrated) or redistribution structures 440.

FIG. 4B is a plan view of a semiconductor chip 500 in which chip pads 520 are arranged along the periphery. For example, a region where chip pads 520 are arranged may be the periphery of a semiconductor chip 500, i.e., a scribe lane region or regions adjacent to the scribe lane region. In the exemplary embodiment, chip via plugs 550 and chip pads 520 may not be aligned according to the inventive concept. Although FIG. 4B illustrates the chip via plugs 550 formed along four sides of the semiconductor chip 500, the chip via plugs 550 may be formed along only one side thereof. That is, the chip via plugs 550 may be formed along one or more sides thereof.

Referring to FIG. 4B, the chip via plugs 550 may be connected to the chip pads 520 and inner circuit interconnection pads 530 using redistribution structures 540. In particular, it is illustrated that two or more chip via plugs 550 are electrically connected to each other. Various connection structures using the redistribution structures 540 will be described in detail below.

FIGS. 5A to 5G are cross-sectional views taken along lines I-I' to VII-VII' of FIGS. 4A and 4B, illustrating semiconductor chips in which chip via plugs and other elements are variously applied according to the inventive concept.

Figure 5A:
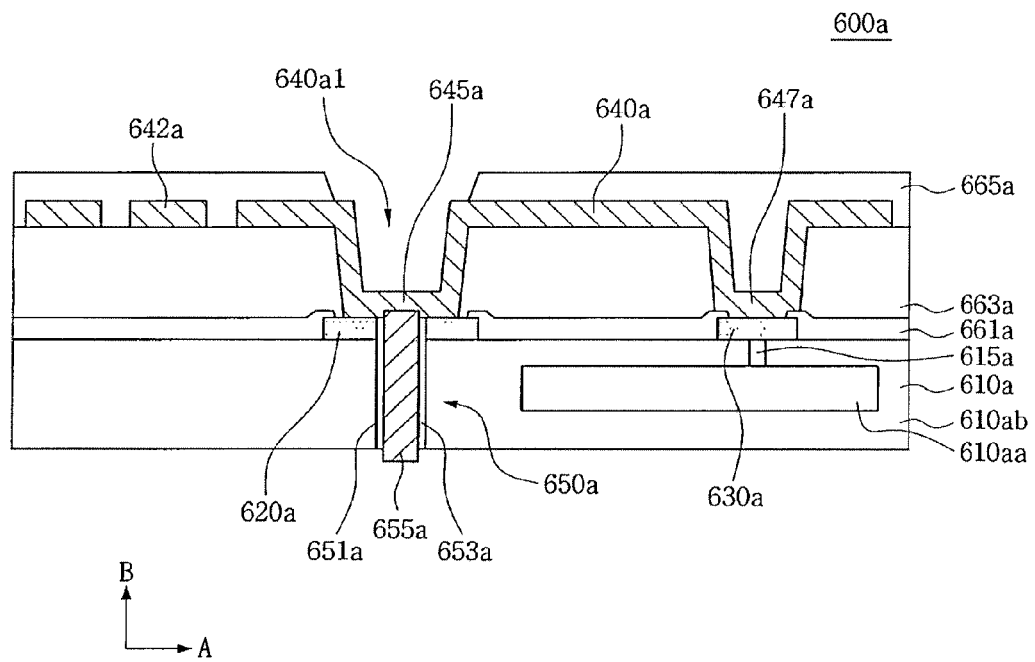
FIGS. 5A to 5G are cross-sectional views taken along lines I-I' to VII-VII' of FIGS. 4A to 4B.

Referring to FIG. 5A, it is a cross-sectional view taken along line I-I' of FIG. 4A. A structure (or semiconductor chip structure) 600a having a first and a second redistribution structures 640a and 642a and a chip via plug 650a according to an exemplary embodiment of the inventive concept includes an chip pad 620a formed on a substrate 610a, an inner circuit interconnection pad 630a, the first and the second redistribution structures 640a and 642a, the chip via plug 650a, and passivation layers 661a, 663a and 665a. The cross section taken along line I-I' schematically shows cross-sections of the first redistribution structure 640a, the second redistribution structure 642a, the chip pad 620a, the inner circuit interconnection pad 630a, and the chip via plug 650a. In this specification, the first redistribution structure 640a formed either on the chip pad 620a or the inner circuit interconnection pad 630a may include a first redistribution via plug 645a or a second redistribution via plug 647a. However, since a process of forming the first redistribution via plug 645a or the second redistribution via plug 647a may be selectively performed, it is not separately illustrated in the drawing. That is, although the first redistribution via plug 645a or the second redistribution via plug 647a are not illustrated in the drawing or described, it should be understood that the first redistribution structure 640a formed either on the chip pad 620a or the inner circuit interconnection pad 630a may include the first redistribution via plug 645a or the second redistribution via plug 647a, or may include them.

The substrate 610a may include one or more inner semiconductor circuit 610aa including a transistor, passive devices including a capacitor, a resistor or a reactor, vertical circuit via connections, and interconnections. The inner semiconductor circuit may be electrically connected to the inner circuit interconnection pads 630a through inner semiconductor circuit interconnections. The substrate 610a may include a material 610ab to cover or seal the one or more inner semiconductor circuit 610aa. The material 610ab may be a plastic material, an insulation material, or a non-conductive material.

The inner semiconductor circuit 610aa may be disposed inside the substrate 610a to be surrounded or covered by the material 610ab. In this case, the inner semiconductor circuit 610aa may be connected to one or more inner circuit interconnection pads 630a through one or more conductive communication plug 615a formed in the material 610ab between one or more terminals of the inner semiconductor circuit 610aa and the inner circuit interconnection pad 630a. The inner semiconductor circuit 610aa may have one or more terminals each connectable to one or more inner circuit interconnection pads 630a.

It is possible that the inner circuit interconnection pad 630a can be formed on a surface of the inner semiconductor circuit 610aa. In this case, the inner circuit interconnection pad 630a may be disposed on a same surface of the substrate 610a and the inner semiconductor circuit 610aa.

The chip pad 620a and the inner circuit interconnection pads 630a may be formed during the same process. The chip pad 620a may be formed larger than the inner circuit interconnection pads 630a in view of appearance.

The first redistribution structure 640a may be formed of a metal, e.g., copper, by a deposition or plating process.

It is possible that the inner circuit interconnection pads 630a and the first redistribution structure 640a may be formed as a single monolithic body during the same process. In this case, the redistribution structure may be formed to provide a direct contact with the inner semiconductor circuit 610aa.

The chip via plugs 650a may include a chip via hole 651a, a sidewall barrier layer 653a, and a conductive plug 655a. The chip via hole 651a may be formed in the shape of a empty column vertically penetrating the substrate 610a. The chip via hole 651a may be formed by various semiconductor patterning techniques such as etching techniques. The chip via hole 651a must not have a physical effect on the inner semiconductor circuit. That is, the inner semiconductor circuit may be designed and manufactured not to be formed in a region where the chip via hole 651a is formed. In the exemplary embodiment, when the chip via plug 650a is formed to overlap the chip pad 620a, the inner semiconductor circuit may not be formed in the substrate 610a corresponding to a lower portion of the chip pad 620a. When the inner semiconductor circuit is formed in the substrate 610a where the chip pad 620a or the chip via plug 650a are to be formed, the chip pad 620a or the chip via plug 650a may be formed on the periphery of the semiconductor chip structure 600a with reference to FIG. 4B.

The sidewall barrier layer 653a may be formed of an insulating layer to electrically insulate the conductive plug 655a from the substrate 610a. When the sidewall barrier layer 653a is formed of an insulating layer, it facilitates the conductive plug 655a to be electrically connected to or insulated from the chip pads 620a as necessary. That is, it provides wide design choices. The detailed description thereof will be provided in detail below. The sidewall barrier layer 653a functions to prevent chemical and atomic reactions between the conductive plug 655a and the substrate 610a and physical effects brought on by them, and to reinforce mutual adhesive strength. A silicon nitride layer, a silicon oxynitride layer, etc. may be applied as the sidewall barrier layer 653a, and a silicon oxide layer or other polymer organic materials may be applied as well. Alternatively, in another exemplary embodiment, the sidewall barrier layer 653a may be formed of a conductive metal. Here, the sidewall barrier layer 653a may be formed of a compound containing Ti/TiN or Ta. Otherwise, the sidewall barrier layer 653a may be multiple layers including at least two of an insulating layer, an adhesive layer, and a conductive layer.

The conductive plug 655a may be formed of a metal, and various metals may be applied. The conductive plug 655a has a large width of several μm to several tens μm in a direction A, and a great depth (thickness) of several hundreds μm in a direction B. Therefore, while the conductive plug 655a may be formed of copper, they may be formed of other metals including tungsten, aluminum, etc. As a result of the experiment, the chip via hole 651a was formed up to a depth (thickness) of about 300 μm.

In the drawing, it is illustrated that the chip pad 620a, the chip via hole 651a, the sidewall barrier layer 653a, and the conductive plug 655a are sequentially formed. While it is illustrated that the sidewall barrier layer 653a has the same height as the surface of the chip pad 620a, it is not necessarily to have the same height. The conductive plug 655a protrudes outward from the surface of the chip pad 620a by a first distance. In the experiment, when the conductive plug 655a protrudes outward from the surface of the chip pad 620a by a second distance, a contact area with the first redistribution structure 640a is increased, so that a contact resistance can be reduced. However, protrusion may not be necessarily formed but may be selectively formed during the process. The first distance and the second distance may be different from each other. However, the present general inventive concept is not limited thereto. It is possible that the first distance and the second distance are same.

The passivation layers 661a, 663a and 665a may be formed of one selected from the group consisting of a silicon oxide layer, a silicon nitride later, a silicon oxynitride layer and a polyimide layer. Here, the polyimide layer may be photosensitive.

The first redistribution structure 640a may have a portion 640a1 to be exposed outside through an opening of the passivation layer 665a. The redistribution via plug 645a may be formed on the portion 640a1 as a single integrated body or may be formed with the portion 640a1 as a single monolithic body. The first redistribution structure 640a may be connected to another conductive plug of another substrate of another semiconductor chip. The conductive plug 655a has opposite end portions, one of which is connected to the first redistribution structure 640a through the chip pad 620a, and the other one of which is connected to another semiconductor chip through another chip via plug thereof.

Figure 5B:
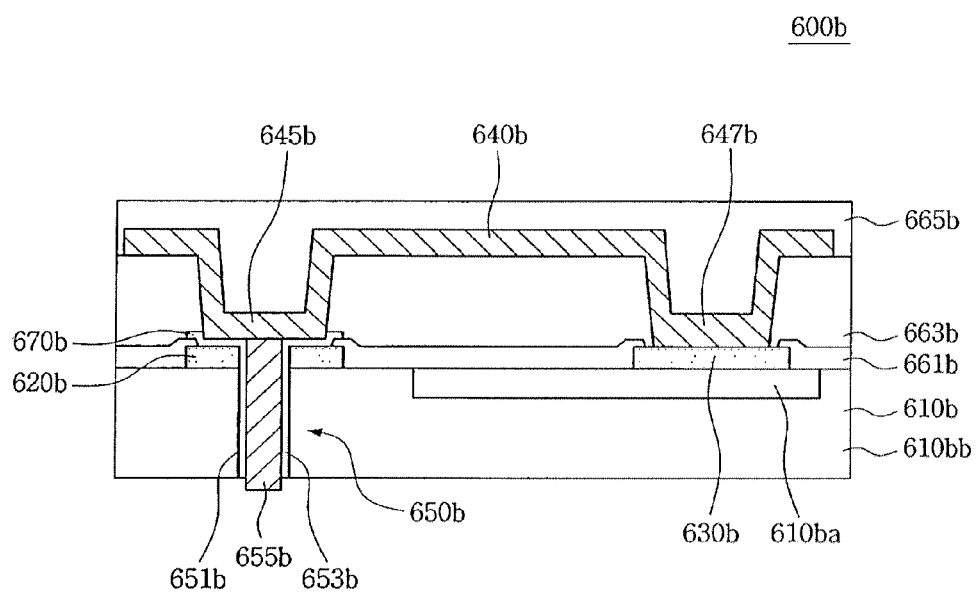

Referring to FIG. 5B, it is a cross-sectional view taken along line II-II' of FIG. 4A. A structure (or semiconductor chip structure) 600b having a redistribution structure 640b and a chip via plug 650b according to another exemplary embodiment of the inventive concept includes an chip pad 620b formed on a substrate 610b, an inner circuit interconnection pad 630b, the redistribution structure 640b, the chip via plug 650b, passivation layers 661b, 663b and 665b and a pad insulating layer 670b. FIG. 5B illustrates that the chip via plug 650b is electrically insulated from the chip pad 620b, and is electrically connected to the inner circuit interconnection pad 630b disposed on a different location.

The chip via plug 650b may be insulated from the aligned chip pad 620b by the pad insulating layer 670b. While the chip via plug 650b is connected to the redistribution structure 640b, the chip via plug 650b and the redistribution structure 640b are insulated from the aligned chip pad 620b by the pad insulating layer 670b. When two semiconductor chips having different specifications are connected to each other through the chip via plug 650b, this exemplary embodiment may be constituted. The exemplary embodiment may be usefully applied when specifications with respect to positions where the chip pad 620b and the inner circuit interconnection pad 630b are formed are defined as the same, and functions of the chip pad 620b and the inner circuit interconnection pad 630b are defined as different from each other. For example, when the chip via plug 650b and the aligned chip pad 620b are used for an electric die sorting (EDS) test in a semiconductor chip, and are used for control signal transfer in the other semiconductor chip, it is required to connect the chip pad 620b formed on different locations in each semiconductor chip. In this case, although the semiconductor chips have different specifications from each other, they may be electrically connected to each other through the chip via plug 650b. This exemplary embodiment was previously illustrated with the connection of the first semiconductor chip 320a to the second semiconductor chip 320b in FIG. 3. Additionally, when a plurality of semiconductor chips are stacked and have various specifications, the redistribution structure 640b formed on the chip pad 620b and the inner circuit interconnection pad 630b may be partially exposed to be connected to another chip via plug of the other semiconductor chip.

The chip via plug 650b may include a chip via hole 651b, a side wall barrier layer 653b formed in the chip via hole 651b, and a conductive plug 655b disposed inside the side wall barrier layer 653b.

The redistribution structure 640b formed either on the chip pad 620b or the inner circuit interconnection pads 630b may be formed of a third redistribution via plug 645b or a fourth redistribution via plug 647b. However, since a process of forming the third redistribution via plug 645b or the fourth redistribution via plug 647b may be selectively performed, it is not separately illustrated in the drawing. That is, although the third redistribution via plug 645b or the fourth redistribution via plug 647b are not illustrated in the drawing or described, it should be understood that the redistribution structure 640b formed either on the chip pad 620b or the inner circuit interconnection pads 630b may be formed on the third redistribution via plug 645b or the fourth redistribution via plug 647b, or may include them.

The substrate 610b may include a material 610bb to cover or seal the one or more inner semiconductor circuit 610ba. The material 610bb may be a plastic material, an insulation material, a non-conductive material, a resilient material, and etc. The material 610bb may be a material to protect the inner semiconductor circuit 610ba from an external force and to prevent the inner semiconductor circuit 610ba from being deformed. It is possible that the substrate 610b may be formed with the inner semiconductor circuit 610ba without the material 610bb.

The inner semiconductor circuit 610*ba* may be disposed inside the substrate 610*a* to be surrounded or covered by the material 610*bb*. In this case, the inner semiconductor circuit 610*ba* may be connected to one or more inner circuit interconnection pad 630*b* through one or more conductive communication lines formed in the material 610*bb* between one or more terminals of the inner semiconductor circuit 610*ba* and the inner circuit interconnection pad 630*b*. The inner semiconductor circuit 610*ba* may have one or more terminals each connectable to one or more inner circuit interconnection pads 630*b*.

It is possible that the inner circuit interconnection pad 630*a* can be formed on a surface of the substrate 610*b*, and a surface of the inner semiconductor circuit 610*ba* may be disposed on a same surface of the substrate 610*b* opposite to the surface on which the inner circuit interconnection pad 630*b* can be formed.

Figure 5C:
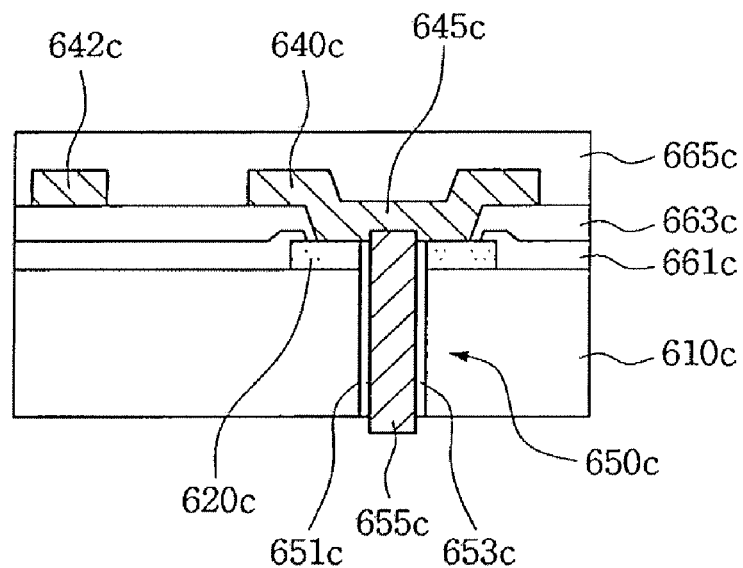

Referring to FIG. 5C, it is a cross-sectional view taken along line III-III' of FIG. 4A. A structure (or semiconductor chip structure) 600*c* having a first and second redistribution structures 640*c* and 642*c* and a chip via plug 650*c* according to an exemplary embodiment of the inventive concept includes an chip pad 620*c* formed on a substrate 610*c*, the redistribution structures 640*c* and 642*c*, the chip via plug 650*c*, and passivation layers 661*c*, 663*c* and 665*c*. In addition, the chip pad 620*c* and the redistribution structures 640*c* and 642*c* may not be exposed to the outside. That is, the chip pad 620*c* and the redistribution structures 640*c* and 642*c* may be covered with at least one passivation layer 665*c*. While the chip via plug 650*c* may be electrically connected to the chip pad 620*c* and the first redistribution structure 640*c*, the first redistribution structure 640*c* is not connected to other elements of the structure 600*c*. That is, the chip via plug 650*c* illustrated in FIG. 5C may be applied when another semiconductor chip is not stacked on the semiconductor chip 610*c*. it is unnecessary to be electrically connected to the stacked semiconductor chip. Alternatively, when the electrical connection to the stacked semiconductor chip is restricted, the chip via plug may be applied. In the exemplary embodiment, the redistribution structure or a redistribution structure pad that are formed over the chip via plug 650*c* may be omitted.

In the exemplary embodiment, the first redistribution structure 640*c* may provide possibilities of being electrically connected to the other semiconductor chip, if necessary.

A redistribution via plug 645*c* may be included in the first redistribution structure 640*c* to connect the chip via plug 650*c* to another semiconductor chip.

The chip via plug 650*c* may include a chip via hole 651*c*, a side wall barrier layer 653*c* formed in the chip via hole 651*c*, and a conductive plug 655*c* disposed inside the side wall barrier layer 653*c*.

Figure 5D:
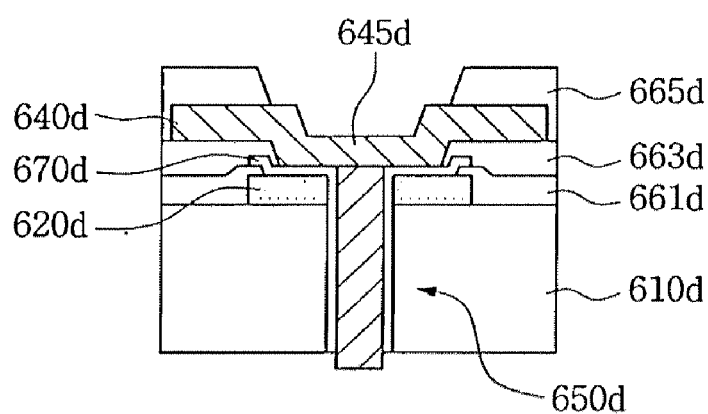

Referring to FIG. 5D, it is a cross-sectional view taken along line IV-IV' of FIG. 4A. A structure (or semiconductor chip structure) 600*d* having a redistribution structure 640*d* and a chip via plug 650*d* according to an exemplary embodiment of the inventive concept includes an chip pad 620*d* formed on a substrate 610*d*, the redistribution structure 640*d*, the chip via plug 650*d*, passivation layers 661*d*, 663*d* and 665*d* and a pad insulating layer 670*d*. Also, a part of the redistribution structure 640*d* may be externally exposed. It is illustrated that the chip via plug 650*d* is electrically insulated from the chip pad 620*d* using the pad insulating layer 670*d*, and is electrically connected to the redistribution structure 640*d* in FIG. 5D. When the semiconductor chips are stacked, a specific semiconductor chip may not require an electrical signal provided through the chip via plug 650*d*. For example, when the chip pad 620*d* of the semiconductor chip are disposed at the same location, but have different functions, it is required to insulate an electrical signal provided through the chip via plug 650*d* that is aligned with or overlaps the chip pad 620*d*. Furthermore, when it is required to transfer an electrical signal that is provided through the chip via plug 650*d* to a chip pad 620*d* or an inner circuit interconnection pad (not illustrated), the method suggested in the exemplary embodiment may be very useful.

A redistribution via plug 645*d* may be included in the redistribution structure 640*d* to connect the chip via plug 650*d* to another semiconductor chip.

Figure 5E:
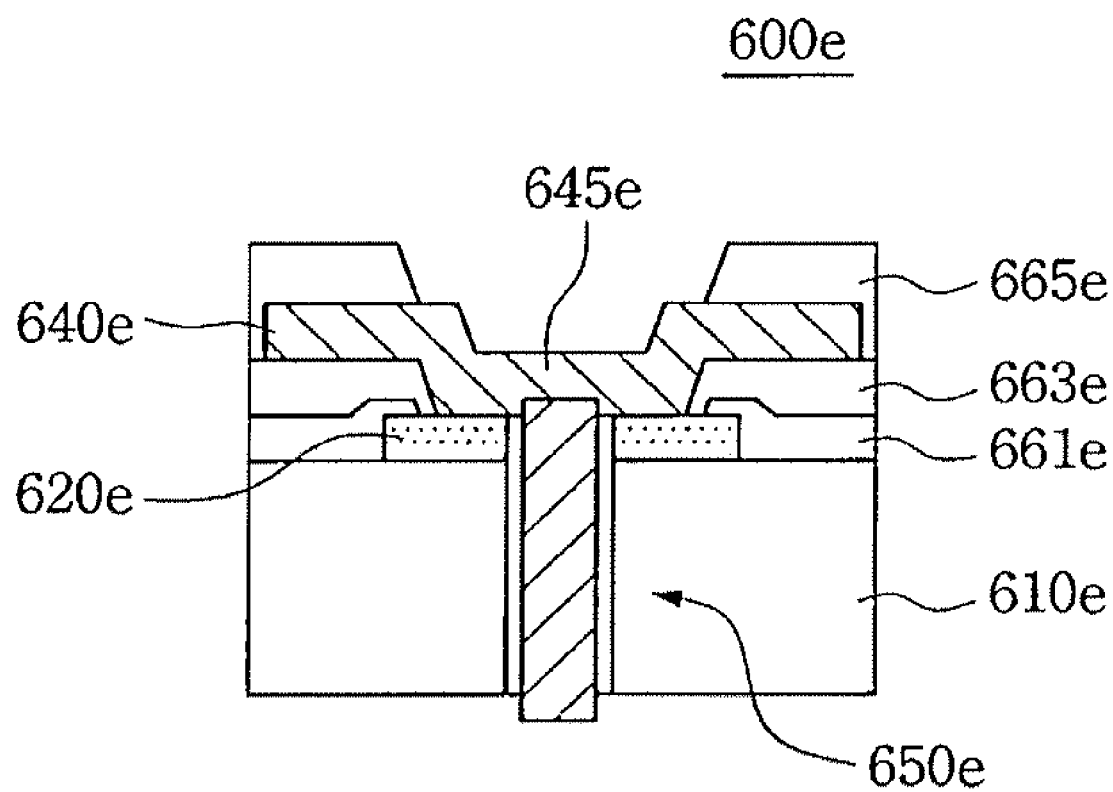

Referring to FIG. 5E, it is a cross-sectional view taken along line V-V' of FIG. 4A. A structure (or semiconductor chip structure) 600*e* of a redistribution structure 640*e* and a chip via plug 650*e* according to an exemplary embodiment of the inventive concept include an chip pad 620*e* formed on a substrate 610*e*, the redistribution structure 640*e*, the chip via plug 650*e*, and passivation layers 661*e*, 663*e* and 665*e*. The chip via plug 650*e* according to the exemplary embodiment that transfers an electrical signal in a vertical direction may be electrically connected to the chip pad 620*e*, and may be electrically connected to another chip via plug included in another semiconductor chip to be stacked on a top portion. In the exemplary embodiment, since it is unnecessary to distribute an electrical signal into the semiconductor chip 600*e* through the redistribution structure 640*e*, and the electrical signal is transferred through the aligned chip pad 620*e* to be used, it may be usefully applied when an electrical signal is transferred to the other semiconductor chip.

A redistribution via plug 645*e* may be included in the redistribution structure 640*e* to connect to another redistribution structure of another inner semiconductor circuit.

Figure 5F:
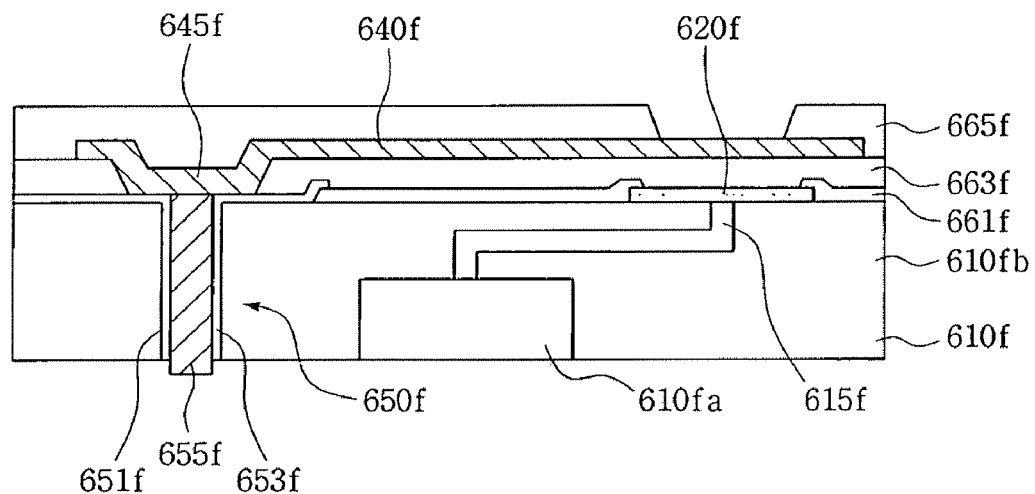

Referring to FIG. 5F, it is a cross-sectional view taken along line VI-VI' of FIG. 4A. A structure (or semiconductor chip structure) 600*f* having a redistribution structure 640*f* and a chip via plug 650*f* according to an exemplary embodiment of the inventive concept includes an chip pad 620*f* formed on a substrate 610*f*, the redistribution structure 640*f*, the chip via plug 650*f*, passivation layers 661*f*, 663*f* and 665*f* and a pad insulating layer 670*f*. In the exemplary embodiment, it is illustrated that the redistribution structure 640*f* is connected to the chip via plug 650*f* and is insulated from the chip pad 620*f*, and a part of the redistribution structure 640*f* is partially exposed to be connected to the other semiconductor chip.

The substrate 610*f* may have an inner semiconductor circuit 610*fa* and/or a material 610*fb*. The inner semiconductor circuit 610*fa* may be disposed not to overlap the chip pad 620*f*. In this case, a conductive communication plug 615*f* can be formed between the inner semiconductor circuit 610*fa* and the chip pad 620*f*. The conductive communication plug 615*f* may have a first portion connected to a terminal of the inner semiconductor circuit 610*fa*, a second portion connected to the chip pad 620*f*, and a third portion formed between the first portion and the second portion. The third portion of the conductive communication plug 615*f* may have a bent portion with respect to the first portion and the second portion.

Figure 5G:
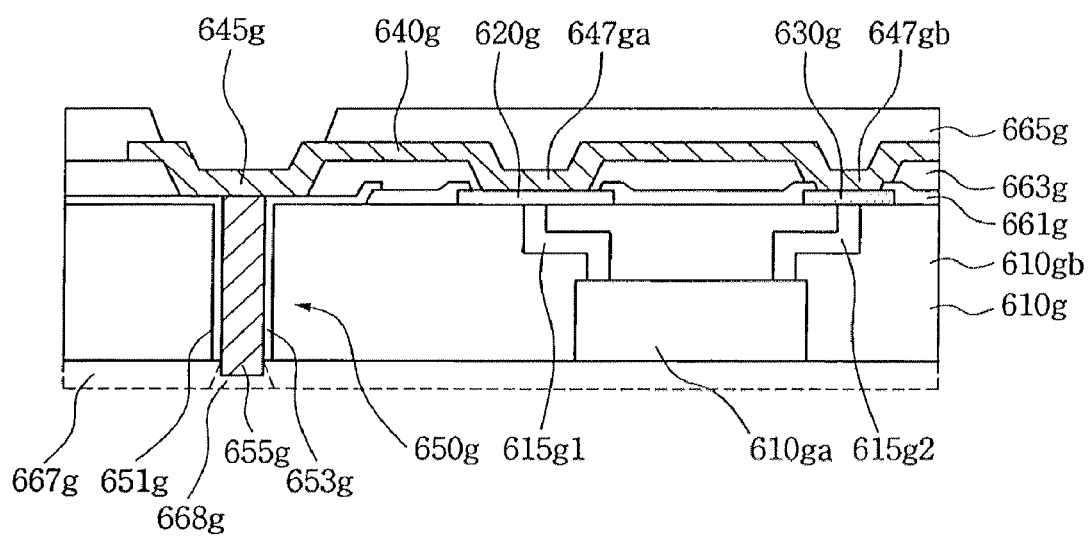

Referring to FIG. 5G, it is a cross-sectional view taken along line VII-VII' of FIG. 4A. A structure (or semiconductor chip structure) 600*g* having a redistribution structure 640*g* and a chip via plug 650*g* according to an exemplary embodiment of the inventive concept includes an chip pad 620*g* formed on a substrate 610*g*, the redistribution structure 640*g*, the chip via plug 650*g*, an inner circuit interconnection pad 630*g*, and passivation layers 661*g*, 663*g* and 665*g*. In the exemplary embodiment, the chip via plug 650*g* is electrically connected to the chip pad 620*g* and the inner circuit interconnection pad 630g through the redistribution structure 640g, and the redistribution structure 640g is exposed to be connected to the outside.

The redistribution structure 640g may include a redistribution via plug 645g. The redistribution structure 640g may further include a first redistribution via plug 647ga and a second redistribution via plug 647gb. The first redistribution via plug 647ga may electrically connect the chip via plug 650g to the chip pad 620g and the second redistribution via plug 647gb may electrically connect the chip plug 650g to the chip pad 630g.

The substrate 610g may have an inner semiconductor circuit 610ga and/or a material 610gb. The inner semiconductor circuit 610ga may be disposed not to overlap the chip pad 620g. However, it is possible that at least a portion of the inner semiconductor circuit 610ga may be disposed not to overlap the chip pad 620g. One or more conductive lines (or one or more conductive communication plug) can be formed between the inner semiconductor circuit 610ga and the chip pad 620g and 630g. A first conductive communication plug 615g1 may be connected between terminals of the inner semiconductor circuit 610ga and the chip pad 620g, and a second conductive communication plug 615g2 may be connected between terminals of the inner semiconductor circuit 610ga and chip pad 630g. At least one of the conductive communication plugs 615g1 and 615g2 may have a bent portion between the terminals. It is also possible that at least one terminal of the inner semiconductor circuit 610ga can be formed on a plane on which the chip pad 620a is formed.

The structure 600g may have a material unit 667g formed on a bottom of the substrate 610g. The material unit 667g may be an insulation layer or a protection layer to cover a lower side or surface of the substrate 610g. When the substrate 610g and the inner semiconductor circuit 610ga have a common surface, for example, the bottom or lower surface, the material unit 667g may be used as a layer to protect the substrate 610g and the inner semiconductor circuit 610ga. The material unit 667g may have a portion 668g to correspond to an end portion of the chip via plug 650g. The portion 668g may not be formed to expose the end portion of the chip via plug 650g such that the end portion of the chip via plug 650g can be connected to another semiconductor chip structure.

While it is not illustrated in FIGS. 5A to 5F, all of the semiconductor chips may include insulating protection layers formed below the substrates. The insulating protection layers may be entirely formed below the substrate to expose or to cover the chip via plugs. The insulating protection layers may play an important part in stacking the semiconductor chips, and may be described in a different name in the applied exemplary embodiment.

Figure 6A:
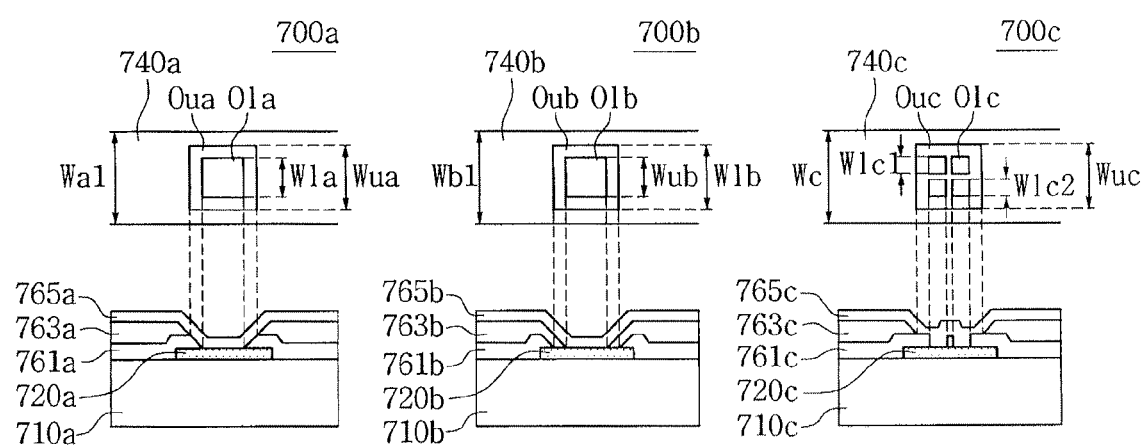
FIGS. 6A to 6C are plan views and cross-sectional views which show the shapes of openings for connecting an chip pad or an inner circuit interconnection pad to a redistribution structure in a semiconductor chip structure according to various exemplary embodiments of the inventive concept.
Figure 6B:
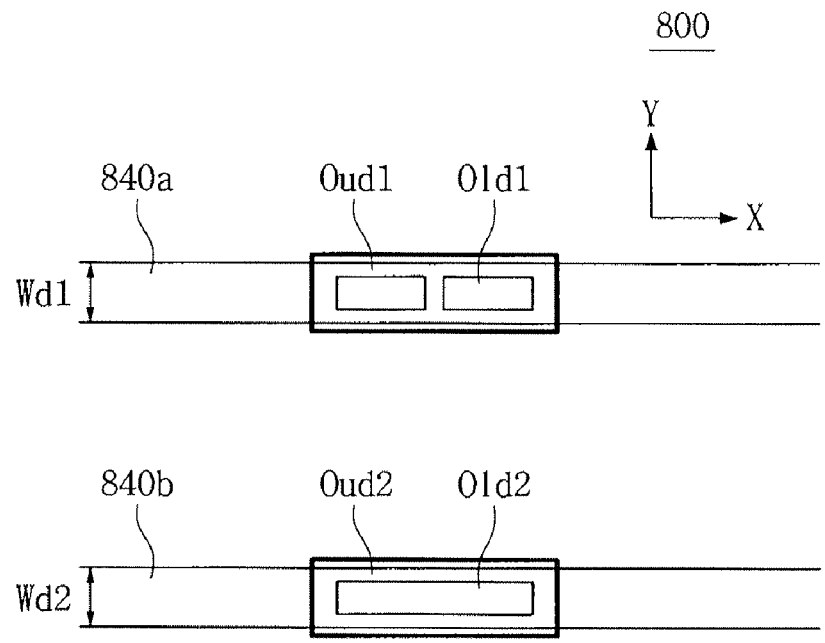
Figure 6C:
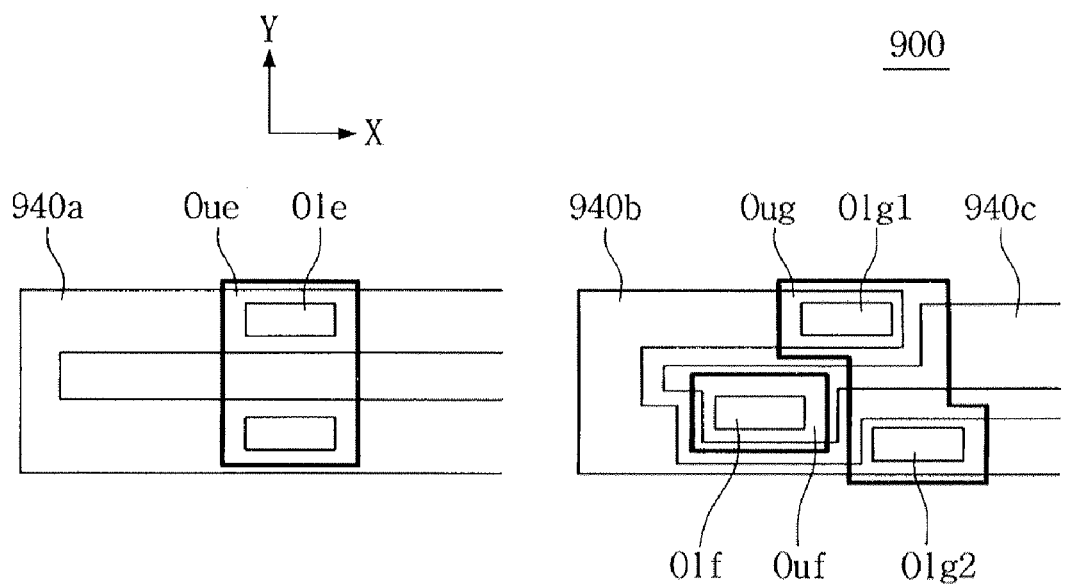

FIGS. 6A to 6C are plan views and cross-sectional views illustrating shapes of openings to connect an chip pad or an inner circuit interconnection pad to a redistribution structure in a semiconductor chip structure according to various exemplary embodiments of the inventive concept. The chip pad and the inner circuit interconnection pad will be referred to as pads to be described. In the drawings, a chip via plug is not illustrated.

Referring to FIG. 6A, when widths Wa1, Wb1 and Wc1 of redistribution structures 740a, 740b and 740c are much larger than widths Wla, Wua, Wlb, Wub, Wlc1, Wlc2 and Wuc of openings Ola, Oua, Olb, Oub, Olc and Ouc, pads 720a, 720b and 720c are designed like a square. Also, in order to expose the pads 720a, 720b and 720c, sizes of lower openings Ola, Olb and Olc of lower passivation layers 761a, 761b and 761c and upper openings Oua, Oub and Ouc of intermediate passivation layers 763a, 763b and 763c are adjusted.

FIG. 6A illustrates that the openings Ola, Olb and Olc of the lower passivation layers 761a, 761b and 761c may be formed different from the openings Oua, Oub and Ouc of the intermediate passivation layers 763a, 763b and 763c in view of size. This provides various possible embodiments to those who desire to embody the technical features of the inventive concept, and may be variously applied when a pad insulating layer (not shown) is further formed. For example, when the pad insulating layer is required to be formed, the openings Ola, Olb and Olc of the lower passivation layers 761a, 761b and 761c may be formed smaller than the openings Oua, Oub and Ouc of the intermediate passivation layers 763a, 763b and 763c to electrically insulate the pads 720a, 720b and 720c from the redistribution structures 740a, 740b and 740c.

A first drawing of FIG. 6A illustrates that the opening Oua of the intermediate passivation layer 763a is formed larger than the opening Ola of the lower passivation layer 761a, and a second drawing illustrates that the opening Oub of the intermediate passivation layer 763b is formed smaller than the opening Olb of the lower passivation layer 761b. Further, a third drawing illustrates that a plurality of openings Olc may be formed in a region that a single pad 720c occupies. Forming a plurality of openings in the same area may cause less process errors than forming a single large opening. In addition, when a chip via plug has a sufficiently low resistance, forming a plurality of chip via plugs may cause less process errors than forming a single large chip via plug to obtain satisfactory results. In the exemplary embodiments, when a region that the pad 720c occupies or a region where the redistribution structure 740c is in contact with the pad 720c is large enough, the sizes of the openings Olc and Ouc of the passivation layers 761c and 763c may be adjusted to obtain optimal results.

Referring to FIG. 6B, widths Wd1 and Wd2 of redistribution structures 840a and 840b may be formed smaller than one of the openings Old1, Oud1, Old2 and Oud2. More specifically, while one of the openings Old1, Oud1, Old2 and Oud2 is formed larger than widths Wd1 and Wd2 of the redistribution structures 840a and 840b, one of the openings Old1, Oud1, Old2 and Oud2 may be formed to extend in a longitudinal direction of the redistribution structures 840a and 840b or a plurality of openings may be formed. The sizes of the lower openings Old1 and Old2 and the upper openings Oud1 and Oud2 may be variously adjusted depending on those who desire to embody the technical features of the inventive concept.

Referring to FIG. 6C, it is illustrated that when two or more openings Ole and Oue may be formed adjacent to each other in a redistribution structure 940a or two or more openings Olg and Oug share two or more redistribution structures 940b and 940c, a region where two openings are to be formed may include one opening. While forming a single large opening may cause a higher process error than forming a plurality of openings, this method may simplify the process. Therefore, unless a pattern has an effect on adjacent patterns, the simplified process may be applied to improve productivity.

The openings Oud1 and Old1 may be disposed in a direction X. The openings Oud1 and Old1 may be disposed in the same direction to form a single opening having a first side in a direction Y and a second side having a longer length than the first side, in the direction, for example, the direction X.

It is also possible that the openings Oue and Ole can be disposed in a direction Y and may have a side in a direction X longer than other side in a direction Y. It is also possible that openings Oug, Olg1, Ouf, Olf, and Olg2 can be arranged in a direction X and in a direction Y, with respect to each other.

While only several exemplary embodiments are simply illustrated and described in FIGS. 6A to 6C, further applications could have been understood and anticipated.

Figure 7A:
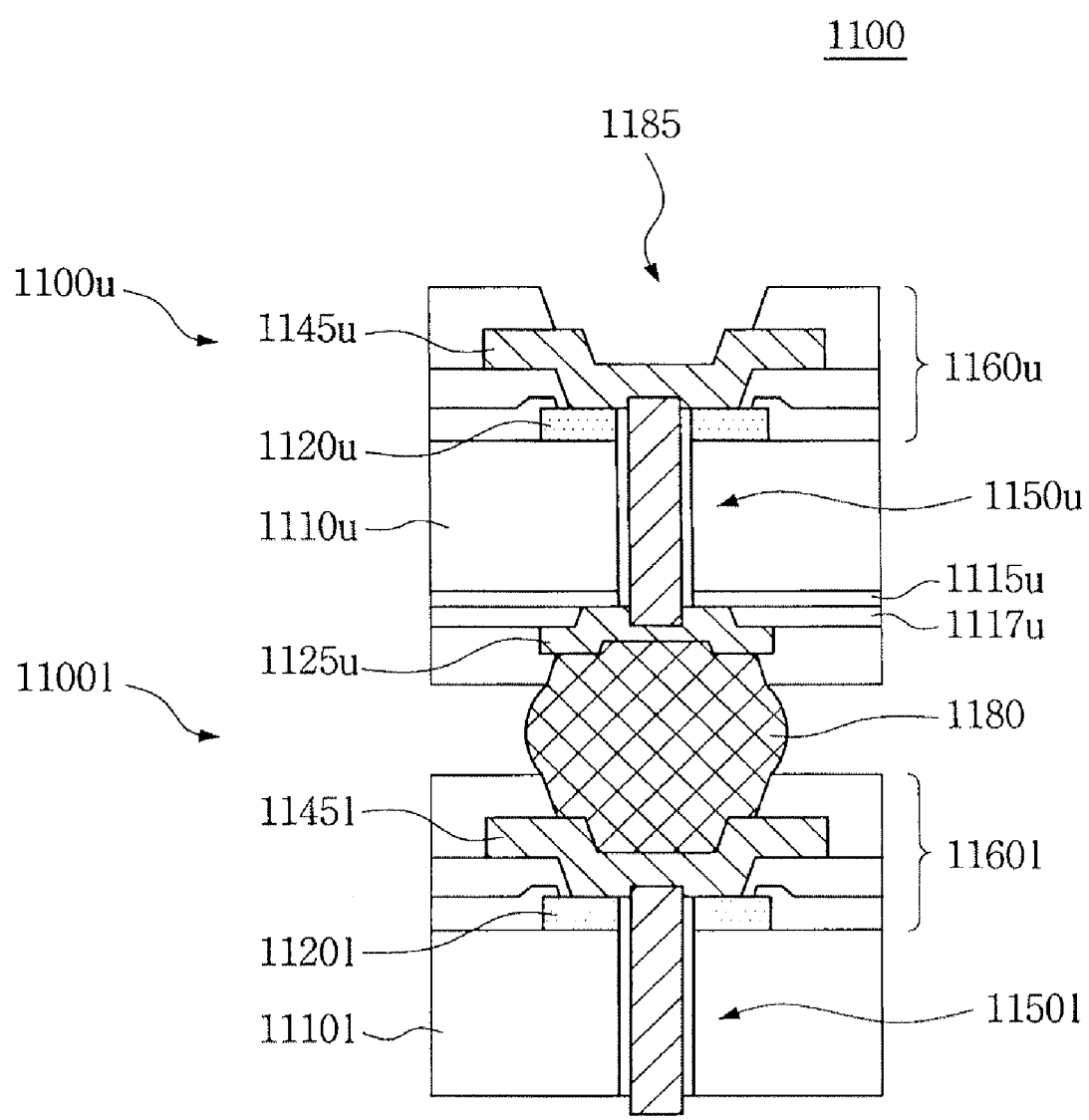
FIGS. 7A and 7B conceptually illustrate a stacked semiconductor chip in which chip via plugs are electrically connected to each other according to exemplary embodiments of the inventive concept.
Figure 7B:
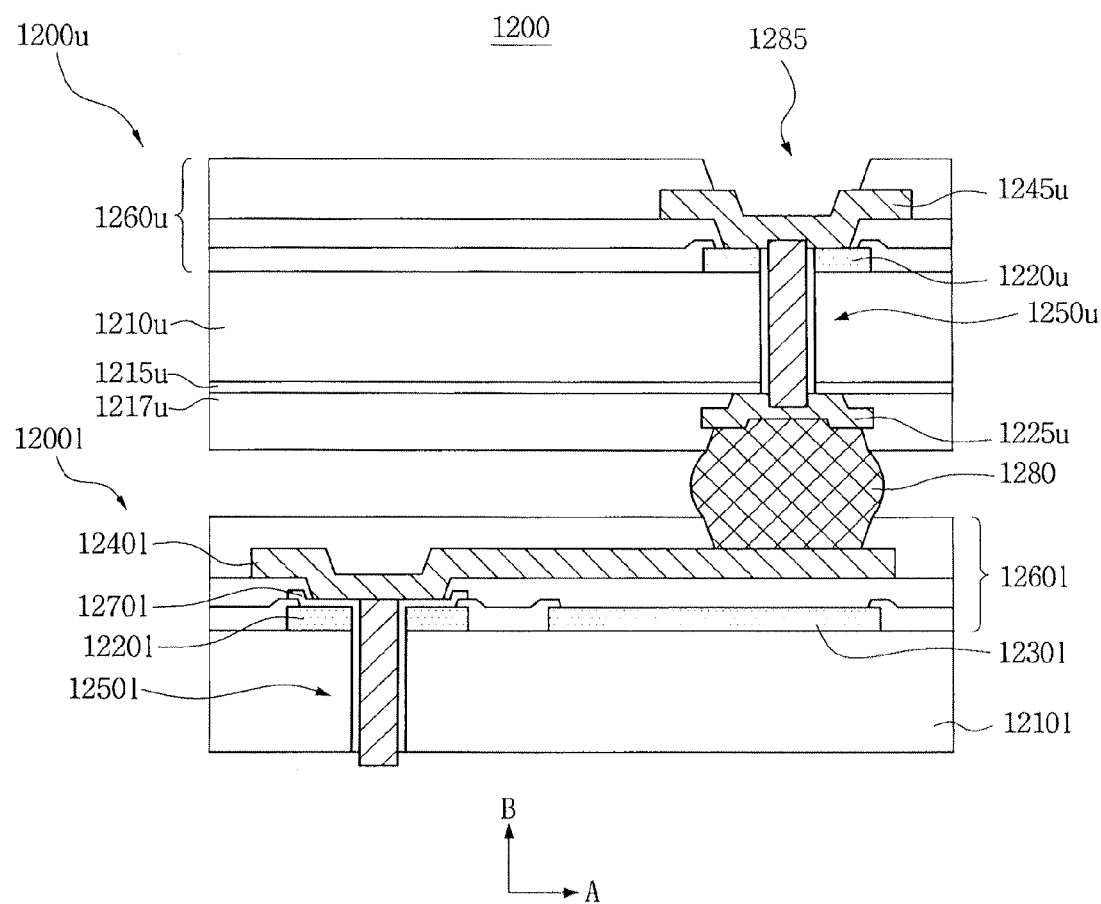

FIGS. 7A and 7B conceptually illustrate a stacked semiconductor chip in which chip via plugs are electrically connected to each other according to exemplary embodiments of the inventive concept.

Referring to FIG. 7A, a lower chip via plug 1110*l* of a lower semiconductor chip 1100*l* is electrically connected to an upper chip via plug 1150*u* of an upper semiconductor chip 1100*u* through a redistribution structure pad 1145*l* and a package bump 1180. A connection bump pad 1125*u* that is electrically connected to a lower end of the upper chip via plug 1150*u* may be formed below the upper semiconductor chip 1100*u*. Therefore, the redistribution structure pad 1145*l* of the lower semiconductor chip 1100*l* may be electrically connected to the connection bump pad 1125*u* of the upper semiconductor chip 1100*u* through a connection bump 1180.

Lower passivation layers 1115*u* and 1117*u* exposing the connection bump pad 1125*u* may be formed below the upper semiconductor chip 1100*u*. The lower passivation layers 1115*u* and 1117*u* may be formed of at least two layers, the first lower passivation layer 1115*u* may be formed below the upper semiconductor chip 1100*u* to expose the lower end of the upper chip via plug 1150*u*, and the second lower passivation layer 1117*u* may be formed to expose the connection bump pad 1125*u*.

While it is illustrated that the connection bump 1180 is in the shape of a ball in the exemplary embodiment, it may be formed in the shape of a hexahedron or a polyhedron, or may be formed to have other shapes. In addition, the upper chip via plug 1150*u* may be directly or indirectly connected to the lower chip via plug 1150*l* using a conductive adhesive without forming the connection bump 1180.

In the exemplary embodiment, it is illustrated that the lower chip via plug 1150*l* is connected to the lower redistribution structure pad 1120*l*.

An opening 1185 on the upper redistribution structure pad 1120*u* of the upper semiconductor chip 1100*u* implies that another semiconductor chip may be stacked thereon to be electrically connected.

The semiconductor chip apparatus 1100 may further include passivation layers 1160*u* and 1160*l*, a redistribution structure pad 1145*u*, chip pads 1120*u*, and substrates 1110*u* and 1110*l*.

Referring to FIG. 7B, a lower chip via plug 1250*l* of a lower semiconductor chip 1200*l* is electrically connected to an upper chip via plug 1250*u* of an upper semiconductor chip 1200*u* through a redistribution structure 1240*l*. Compared with FIG. 7A, it is illustrated that a connection bump 1280 is not aligned with the lower chip via plug 1250*l*, and is formed at an extended place to be electrically connected to the upper chip via plug 1250*u* through the redistribution structure 1240*l*.

A pad insulating layer 1270*l* may be formed between the lower chip via plug 1250*l* and a lower chip pad 1220*l*. That is, the lower chip via plug 1250*l* may be insulated from the lower redistribution structure pad 1220*l*.

Also, the redistribution structure 1240*l* may be insulated from an inner circuit interconnection pad 1230*l*, and the redistribution structure 1240*l* may be electrically connected to the inner circuit interconnection pad 1230*l*. This could have been sufficiently understood with reference to FIGS. 5A or 5B.

The semiconductor chip apparatus 1200 may further include passivation layers 1260*u*, 1215*u*, 1217*u*, and 1260*l*, an opening 1285, a redistribution structure pad 1245*u*, chip pads 1220*u*, a connecting bump pad 1225*u*, and substrates 1210*u* and 1210*l*.

As illustrated in FIG. 7A and 7B, the chip via plugs can be disposed on corresponding lines parallel to a direction A. It is possible that one chip via plug may be spaced apart from another chip via plug by a distance. The distance may be longer than a width of the connecting bump 1180 or 1280 in a direction X.

A bottom surface of the upper semiconductor chip 1200*u* and an upper surface of the lower semiconductor chip 1200*l* may be spaced apart from each other by a height. The height may be smaller than a height of the connecting bump 1180 or 1280 in the direction B. It is also possible that the height can be zero according to the height of the connection bump 1180 or 1280.

Figure 8:
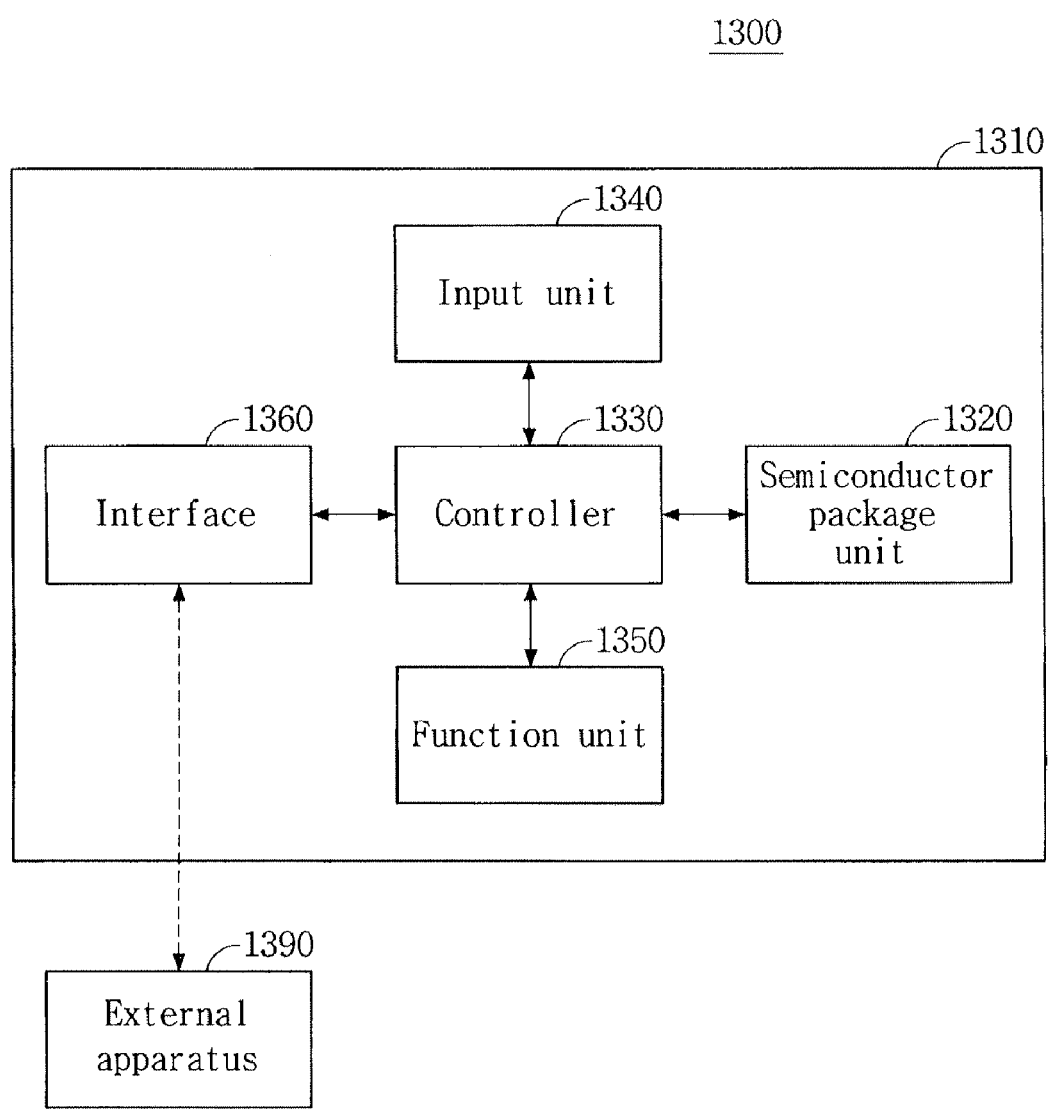
FIG. 8 is a block diagram illustrating an electronic apparatus according to exemplary embodiments of the inventive concept.

FIG. 8 is a block diagram illustrating an electronic apparatus 1300 according to an embodiment of the present general inventive concept. The electronic apparatus 1300 may include a housing 1310 to accommodate elements or units of the electronic apparatus 1300, a memory unit 1320, a controller 1330, an input/output unit 1340, a function unit 1350, and/or an interface unit 1360 to communicate with an external apparatus 1390 through a wired or wireless communication line to receive and transmit data or signal. At least one of the semiconductor chip, the semiconductor chip stack, and the semiconductor device package illustrated in FIGS. 1 through 7B can be used as the memory unit 1320. Therefore, the memory unit 1320 can be referred to as the semiconductor chip, the semiconductor chip stack, or the semiconductor device package. The chip via plugs, chip bumps, or package bumps (as illustrated in FIGS. 1 through 7B) of the memory unit 1320 can be connected to corresponding terminals of controller 1330 to receive data to be stored or processed in the inner semiconductor circuit or to transmit the stored or processed data. The data may be input through the input/output unit 1340, the function unit 1350, and/or the external apparatus 1390 through the interface unit 1360.

The function unit 1350 may be a unit to perform a function or operation of the electronic apparatus 1300. For example, when the electronic apparatus 1300 is an image processing apparatus, a television apparatus, or a monitor apparatus, the function unit 1350 may be a display unit to display an image and/or an audio output unit to generate a signal or sound according to the data. When the electronic apparatus is a mobile phone, the function unit 1350 may be a mobile phone function unit to perform a mobile phone function, for example, dialing, text messaging, photographing using a camera unit formed on the housing 1310, audio and video data processing to be displayed on a display unit formed on the housing 1310, etc. When the electronic apparatus is an image forming or scanning apparatus, the function unit 1350 may be an image forming unit to feed a printing medium, to form or print an image on the printing medium, or to scan a document or picture to be stored in the memory unit. When the electronic apparatus 1300 is a camera or camcorder, the function unit 1350 may be a unit to photograph an image as a movie or a still image.

The controller 1330 controls elements and units of the electronic apparatus 1300 or may be a processor. At least one of the semiconductor chip, the semiconductor chips, and the semiconductor device package illustrated in FIGS. 1 through 7B can be used as the controller 1330. Therefore, the controller 1330 can be referred to as the semiconductor chip, the semiconductor chips, the semiconductor device package, or a semiconductor device package unit. The chip via plugs, chip bumps, or package bumps (as illustrated in FIGS. 1 through

What is claimed is:

1. A semiconductor chip comprising:
a substrate including an inner semiconductor circuit;
a conductive inner circuit interconnection pad and a conductive chip pad disposed on a top surface of the substrate, the conductive chip pad and the conductive inner circuit interconnection pad being formed at the same level, wherein the conductive chip pad is disposed at a center line of the top surface;
an upper passivation layer on the conductive inner circuit interconnection pad and the conductive chip pad;
a conductive redistribution structure formed on the upper passivation layer, the conductive redistribution structure including a conductive redistribution interconnection and a first and second conductive redistribution via plugs,
wherein the first conductive redistribution via plug is connected to the conductive inner circuit interconnection pad; and
a conductive chip via plug configured to penetrate the substrate and electrically connect to the conductive redistribution interconnection through the second conductive redistribution via plug,
wherein the conductive chip via plug comprises a chip via hole configured to penetrate the substrate, a sidewall barrier layer formed on a sidewall of the chip via hole, and a conductive plug on the sidewall barrier layer configured to fill the chip via hole.

2. The semiconductor chip of claim 1, wherein the conductive chip via plug is aligned with the conductive chip pad.

3. The semiconductor chip of claim 1, wherein the conductive chip via plug is electrically connected to the conductive chip pad.

4. The semiconductor chip of claim 1, wherein the conductive chip via plug is electrically connected to the conductive redistribution structure.

5. The semiconductor chip of claim 1, wherein the sidewall barrier layer is formed of an insulating material.

6. The semiconductor chip of claim 1, further comprising: a pad insulating layer between the second conductive redistribution via plug and the conductive chip pad, the pad insulating layer insulating the second conductive redistribution via plug and the conductive chip pad.

7. The semiconductor chip of claim 1, further comprising: a lower passivation layer formed below the substrate.

8. The semiconductor chip of claim 1, wherein the conductive chip via plug corresponds to a supply voltage node of the semiconductor chip.

9. A semiconductor chip comprising:
a substrate including an inner semiconductor circuit;
a conductive inner circuit interconnection pad and a conductive chip pad disposed on a top surface of the substrate, the conductive chip pad and the conductive inner circuit interconnection pad being formed at the same level, wherein the conductive chip pad is disposed at a center line of the top surface;
an upper passivation layer on the conductive inner circuit interconnection pad and the conductive chip pad;
a conductive redistribution structure formed on a surface of the upper passivation layer, the conductive redistribution structure electrically connected to the conductive inner semiconductor through a first conductive redistribution via plug; and
a conductive chip via plug penetrating the substrate, the conductive chip via plug connected to the conductive redistribution structure through a second conductive redistribution via plug,
wherein the conductive chip via plug comprises a chip via hole configured to penetrate the substrate, a sidewall barrier layer formed on a sidewall of the chip via hole, and a conductive plug on the sidewall barrier layer configured to fill the chip via hole.

10. A semiconductor stack, comprising:
a first semiconductor chip; and
a second semiconductor chip stacked on the first semiconductor chip,
wherein each of the semiconductor chips comprises:
a substrate including an inner semiconductor circuit;
a conductive inner circuit interconnection pad and a conductive chip pad disposed on a top surface of the substrate, the conductive chip pad and the conductive inner circuit interconnection pad being formed at the same level, wherein the conductive chip pad is disposed at a center line of the top surface;
an upper passivation layer on the conductive inner circuit interconnection pad and the conductive chip pad;
a conductive redistribution structure formed on the upper passivation layer, the conductive redistribution structure including a conductive redistribution interconnection and a first and second conductive redistribution via plug,
wherein the first conductive redistribution via plug is connected to the conductive inner circuit interconnection pad; and
a conductive chip via plug configured to penetrate the substrate and electrically connected to the conductive redistribution interconnection through the second conductive redistribution via plug,
wherein the conductive chip via plug comprises a chip via hole configured to penetrate the substrate, a sidewall barrier layer formed on a sidewall of the chip via hole, and a conductive plug on the sidewall barrier layer configured to fill the chip via hole,
wherein the conductive chip via plug and the conductive chip pad are aligned each other,
wherein the conductive chip via plug of the first semiconductor chip is electrically connected to the conductive chip via plug of the second semiconductor chip.

11. The semiconductor stack of claim 10, wherein the second semiconductor chip further comprises a connection bump pad formed below the conductive chip via plug, and the connection bump pad is electrically connected to the conductive chip via plug of the first semiconductor chip.

12. The semiconductor stack of claim 10, wherein the conductive redistribution structure of the first semiconductor chip is partially exposed, and the exposed part of the conductive redistribution structure of the first semiconductor chip is electrically connected to the conductive chip via plug of the second semiconductor chip.

13. A semiconductor device package comprising:
a first semiconductor chip disposed on a package substrate; and
a second semiconductor chip stacked on the first semiconductor chip,
wherein each of the semiconductor chips comprises:
a substrate including an inner semiconductor circuit;
a conductive inner circuit interconnection pad and a conductive chip pad disposed on a top surface of the substrate, the conductive chip pad and the conductive inner circuit interconnection pad being formed at the same level, wherein the conductive chip pad is disposed at a center line of the top surface;
an upper passivation layer on the conductive inner circuit interconnection pad and the conductive chip pad;
a conductive redistribution structure formed on the upper passivation layer, the conductive redistribution structure including a conductive redistribution interconnection and a first and second conductive redistribution via plugs,
wherein the first conductive redistribution via plug is connected to the conductive inner circuit interconnection pad; and
a conductive chip via plug configured to penetrate the substrate and to electrically connect to the conductive redistribution interconnection through the second conductive redistribution via plug,
wherein the conductive chip via plug comprises a chip via hole configured to penetrate the substrate, a sidewall barrier layer formed on a sidewall of the chip via hole, and a conductive plug on the sidewall barrier layer configured to fill the chip via hole,
wherein the conductive chip via plug of the first semiconductor chip is electrically connected to the conductive chip via plug of the second semiconductor chip, and the conductive chip via plug of the first semiconductor chip is electrically connected to a package substrate pad of the package substrate.

14. An electronic apparatus comprising:
a function unit to perform a function thereof; and
an semiconductor chip connected to the function unit to control the function, and comprising:
a substrate including an inner semiconductor circuit, a conductive inner circuit interconnection pad and a conductive chip pad disposed on a top surface of the substrate, the conductive chip pad and the conductive inner circuit interconnection pad being formed at the same level, wherein the conductive chip pad is disposed at a center line of the top surface, an upper passivation layer on the conductive inner circuit interconnection pad and the conductive chip pad, a conductive redistribution structure formed on a surface of the upper passivation layer, the conductive redistribution structure electrically connected to the conductive inner semiconductor circuit through a first conductive redistribution via plug, and a conductive chip via plug penetrating the substrate, the conductive chip via plug connected to the conductive redistribution structure through a second conductive redistribution via plug,
wherein the conductive chip via plug comprises a chip via hole configured to penetrate the substrate, a sidewall barrier layer formed on a sidewall of the chip via hole, and a conductive plug on the sidewall barrier layer configured to fill the chip via hole,
wherein one of the conductive chip via plugs and the conductive redistribution structure is electrically connected to the function unit.

15. The electronic apparatus of claim 13, wherein the conductive chip via plug is aligned to the package substrate pad.

16. The semiconductor device package of claim 13, wherein the conductive chip via plug of the first semiconductor chip is not aligned with the chip via plug of the second semiconductor chip.

* * * * *